United States Patent
Vankayala et al.

(10) Patent No.: US 12,302,171 B2
(45) Date of Patent: May 13, 2025

(54) METHODS AND SYSTEMS FOR REDUCING FRONTHAUL BANDWIDTH IN A WIRELESS COMMUNICATION SYSTEM

(71) Applicant: Samsung Electronics Co., Ltd., Suwon-si (KR)

(72) Inventors: Satya Kumar Vankayala, Bangalore (IN); Gaurav Potnis, Bangalore (IN); Satya Venkata Umakishore Godavarti, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 316 days.

(21) Appl. No.: 17/912,728

(22) PCT Filed: Mar. 16, 2021

(86) PCT No.: PCT/KR2021/003194
§ 371 (c)(1),
(2) Date: Sep. 19, 2022

(87) PCT Pub. No.: WO2021/187848
PCT Pub. Date: Sep. 23, 2021

(65) Prior Publication Data
US 2023/0143476 A1    May 11, 2023

(30) Foreign Application Priority Data
Mar. 17, 2020 (IN) .............................. 202041011371

(51) Int. Cl.
*H04W 28/06* (2009.01)
*H04W 92/10* (2009.01)
(52) U.S. Cl.
CPC .......... *H04W 28/065* (2013.01); *H04W 92/10* (2013.01)

(58) Field of Classification Search
None
See application file for complete search history.

(56) References Cited

U.S. PATENT DOCUMENTS 9,681,332 B2 *   6/2017  Min ................. H04W 52/0251
9,826,541 B1 *  11/2017  Gitlin .............. H04W 72/543
(Continued)

FOREIGN PATENT DOCUMENTS

KR   10-2019-0129856 A   11/2019
KR   10-2020-0005365 A    1/2020
WO      2019/183020 A1    9/2019

OTHER PUBLICATIONS

Hongbo Si et al., A Novel and Efficient Vector Quantization Based CPRI Compression Algorithm, IEEE Transactions on Vehicular Technology, Aug. 2017.
(Continued)

*Primary Examiner* — Faiyazkhan Ghafoerkhan
(74) *Attorney, Agent, or Firm* — Jefferson IP Law, LLP

(57) ABSTRACT

The present disclosure relates to a pre-5$^{th}$-Generation (5G) or 5G communication system to be provided for supporting higher data rates Beyond 4$^{th}$-Generation (4G) communication system such as Long Term Evolution (LTE). The present disclosure provides methods and systems for reducing fronthaul bandwidth. Embodiments herein relate to the field of wireless networks and more particularly to reducing fronthaul bandwidth during a transfer of data between at least one radio node and at least one centralized node in a wireless network. A method disclosed herein includes determining parameters specific to at least one User Equipment (UE) using a machine learning method. The method further includes transferring data between the at least one radio node and the at least one centralized node over a fronthaul link by compressing the data using the parameters that are determined using the machine learning method. The method (Continued)

further includes decompressing, by at least one of the at least one radio node and the at least one centralized node, the compressed data using the parameters that are determined using the machine learning method.

15 Claims, 11 Drawing Sheets

(56) References Cited

U.S. PATENT DOCUMENTS

| | | | | |
|---|---|---|---|---|
| 9,998,310 | B2* | 6/2018 | Barbieri | H04L 12/4604 |
| 10,355,895 | B2* | 7/2019 | Barbieri | H04L 69/40 |
| 10,608,734 | B2* | 3/2020 | Barbieri | H04W 28/0289 |
| 10,616,016 | B2* | 4/2020 | Fertonani | H04B 1/1661 |
| 10,673,502 | B2* | 6/2020 | Lee | H04B 7/06 |
| 10,749,721 | B2* | 8/2020 | Fertonani | H04L 9/40 |
| 11,943,045 | B2* | 3/2024 | Barbieri | H04B 7/15507 |
| 12,016,084 | B2* | 6/2024 | Barbieri | H04L 1/0002 |
| 2010/0067489 | A1* | 3/2010 | Pelletier | H04W 48/17 370/392 |
| 2010/0103864 | A1* | 4/2010 | Ulupinar | H04L 69/22 370/315 |
| 2010/0260129 | A1* | 10/2010 | Ulupinar | H04L 69/04 370/329 |
| 2010/0322146 | A1* | 12/2010 | Liu | H04W 84/047 455/7 |
| 2011/0249609 | A1* | 10/2011 | Brusilovsky | H04W 12/80 370/315 |
| 2015/0382235 | A1* | 12/2015 | Min | H04L 45/22 370/230 |
| 2016/0142951 | A1* | 5/2016 | Balasubramanian | H04W 36/0033 370/331 |
| 2017/0238361 | A1* | 8/2017 | Pawar | H03M 7/40 455/561 |
| 2017/0373890 | A1* | 12/2017 | Fertonani | H04L 27/0002 |
| 2018/0013581 | A1* | 1/2018 | Fertonani | H04L 69/04 |
| 2018/0013597 | A1* | 1/2018 | Barbieri | H04L 1/1893 |
| 2018/0034669 | A1* | 2/2018 | Barbieri | H04L 27/26 |
| 2018/0287696 | A1* | 10/2018 | Barbieri | H04W 36/08 |
| 2019/0007246 | A1* | 1/2019 | Fertonani | H04L 25/02 |
| 2019/0208575 | A1* | 7/2019 | Barbieri | H04W 72/0446 |
| 2020/0204252 | A1* | 6/2020 | Barbieri | H04W 36/087 |
| 2020/0366542 | A1* | 11/2020 | Barbieri | H04L 1/0006 |
| 2023/0143476 | A1* | 5/2023 | Vankayala | H04W 28/065 370/230 |
| 2024/0259091 | A1* | 8/2024 | Barbieri | H04W 36/22 |

OTHER PUBLICATIONS

Jinseok Choi et al., Space-Time Fronthaul Compression of Complex Baseband Uplink LTE Signals, 2016 IEEE International Conference on Communications (ICC).
Leonardo Ramalho et al., Improved LPC-Based Fronthaul Compression with High Rate Adaptation Resolution, IEEE Communications Letters, Mar. 2018.
Seok-Hwan Park et al., Fronthaul Compression for Cloud Radio Access Networks: Signal processing advances Inspired by network information theory, IEEE Signal Processing Magazine, Nov. 2014.
Indian Office Action dated Mar. 11, 2021, issued in Indian Patent Application No. 202041011371.
Extended European Search Report dated Jul. 19, 2023, issued in a European Patent Application No. 21771652.1.

* cited by examiner

[Fig. 1A]
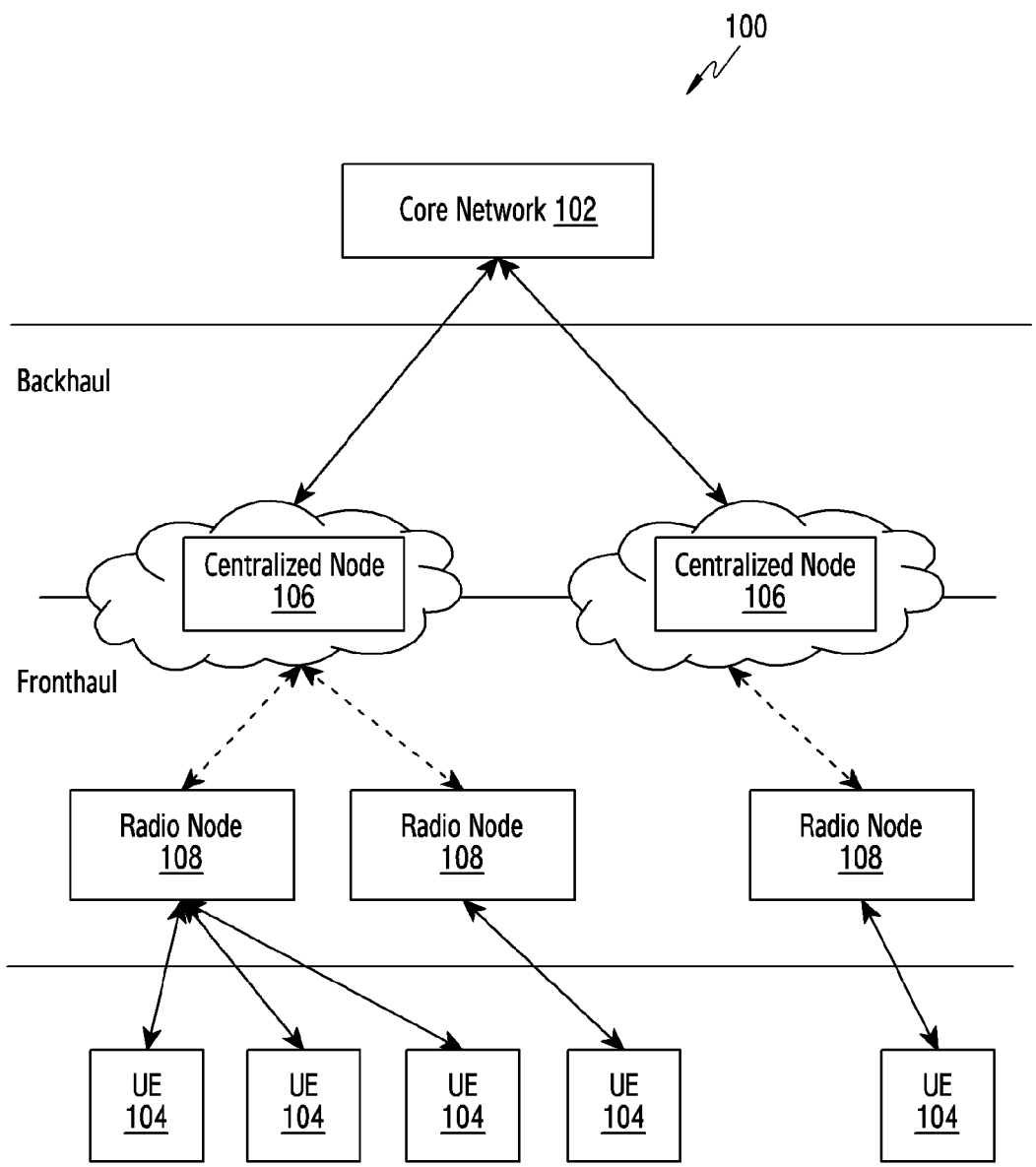

[Fig. 1B]
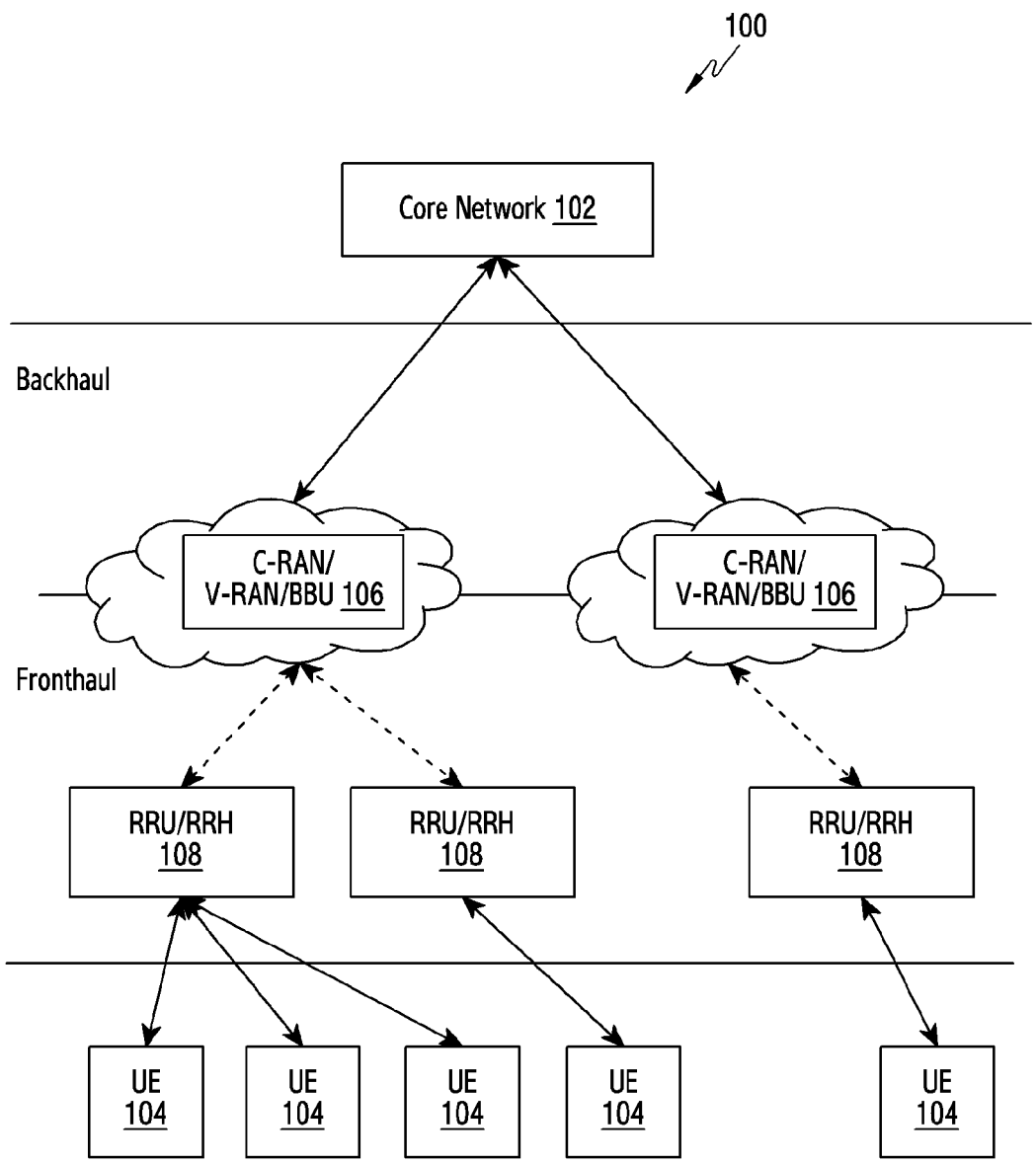

[Fig. 1C]
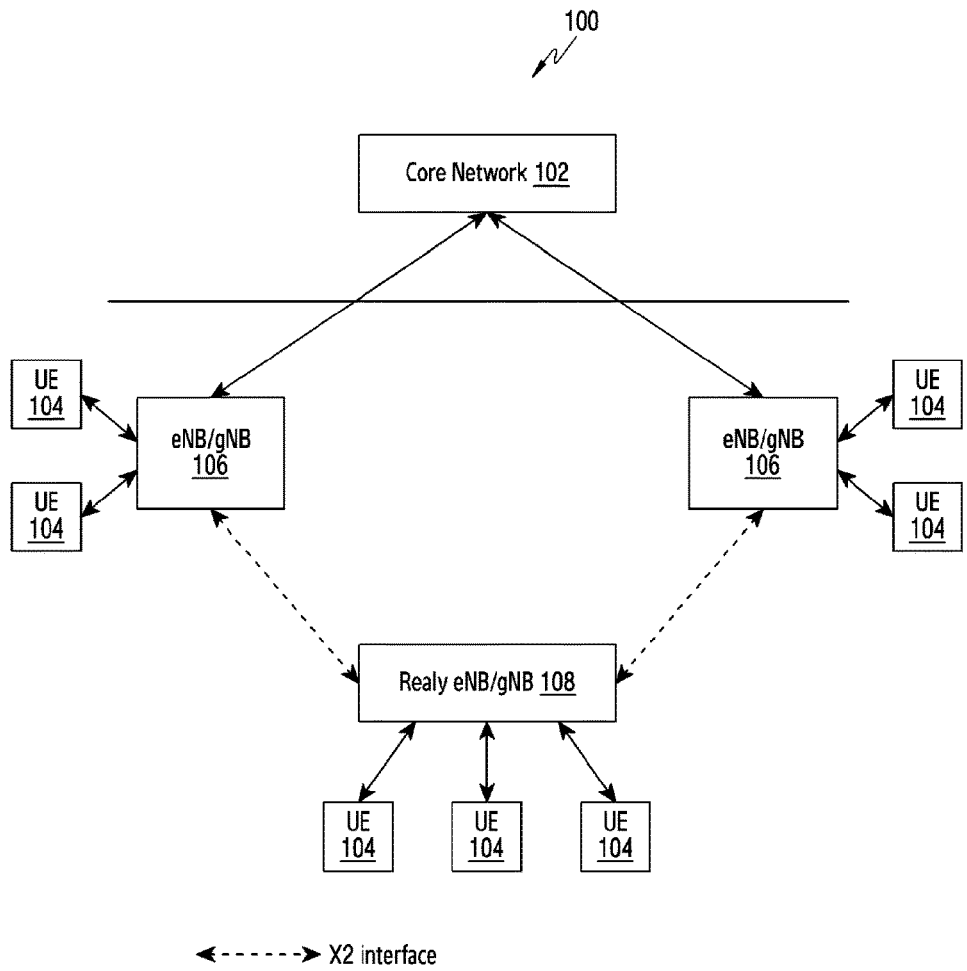
[Fig. 2A]
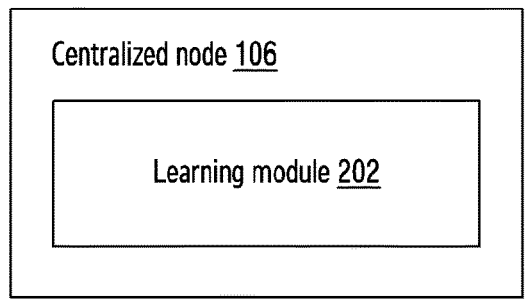
[Fig. 2B]
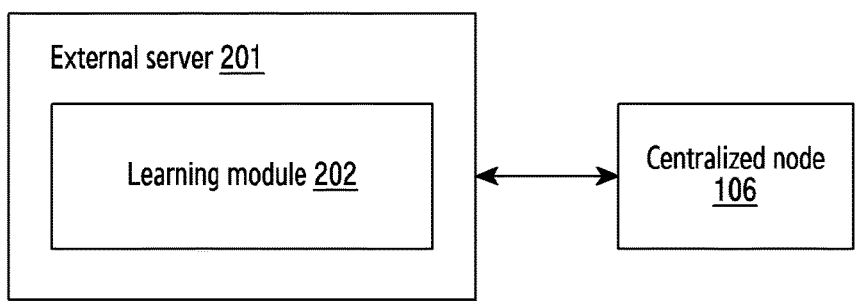

[Fig. 3]
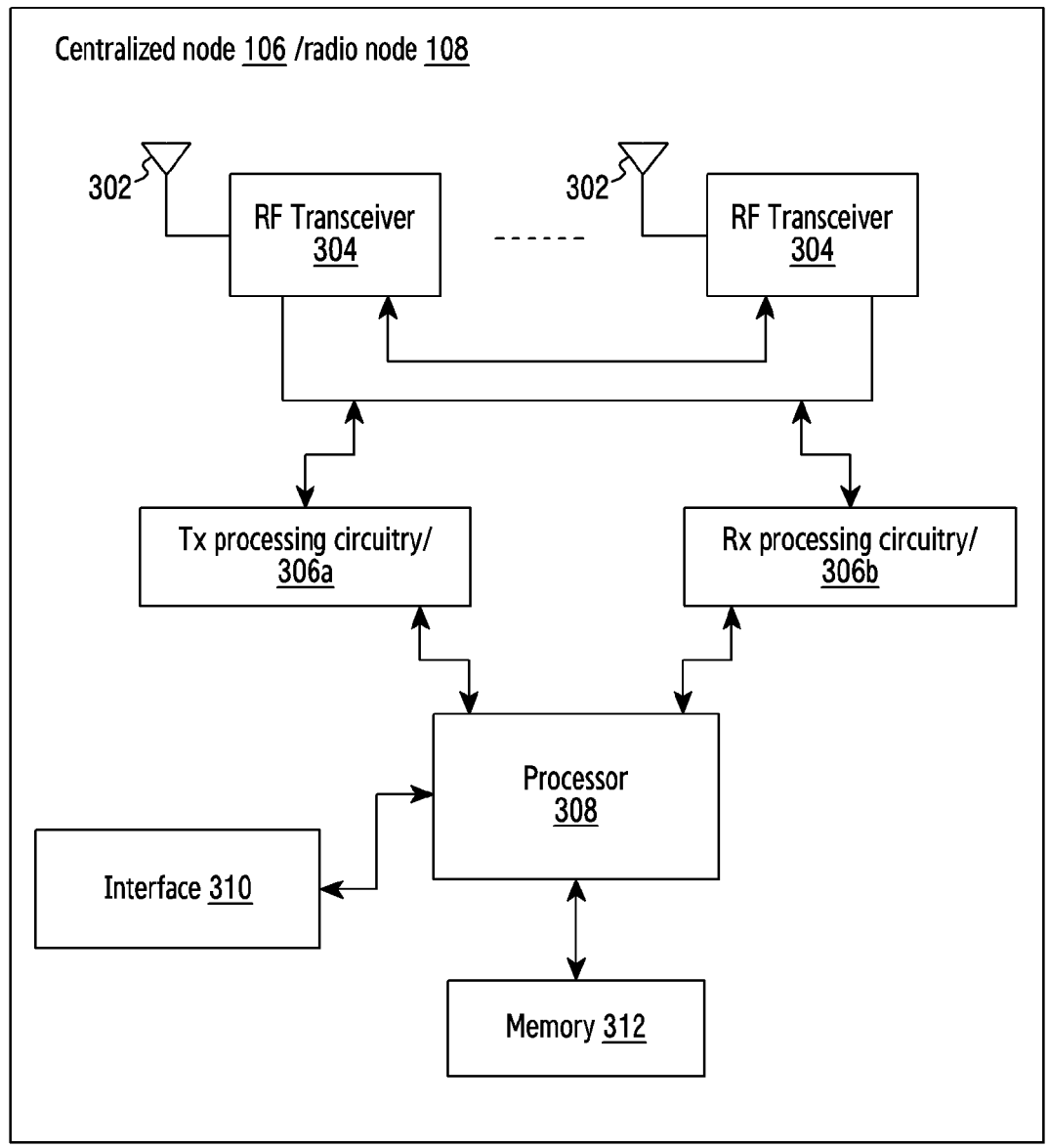

[Fig. 4A]
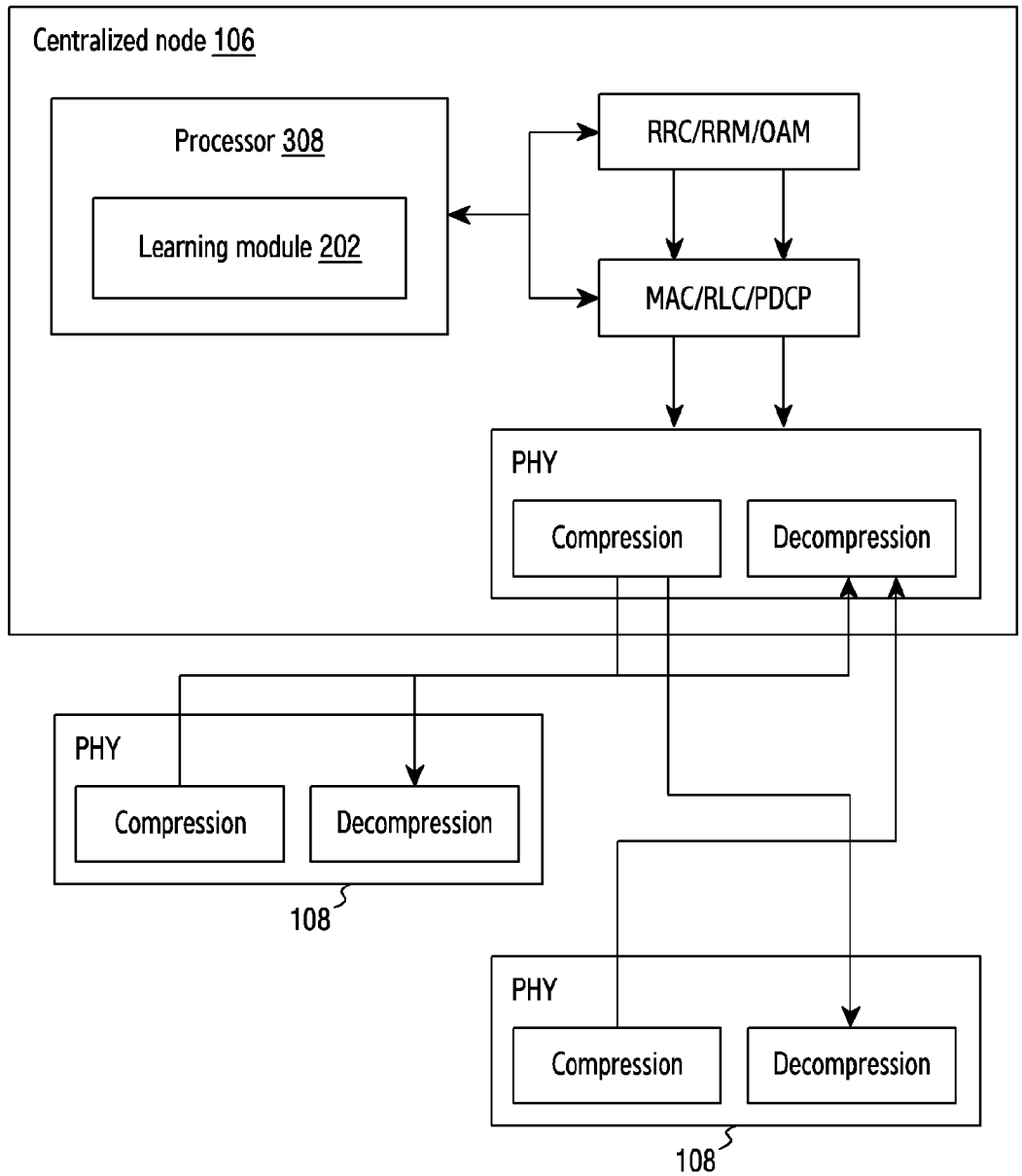

[Fig. 4B]
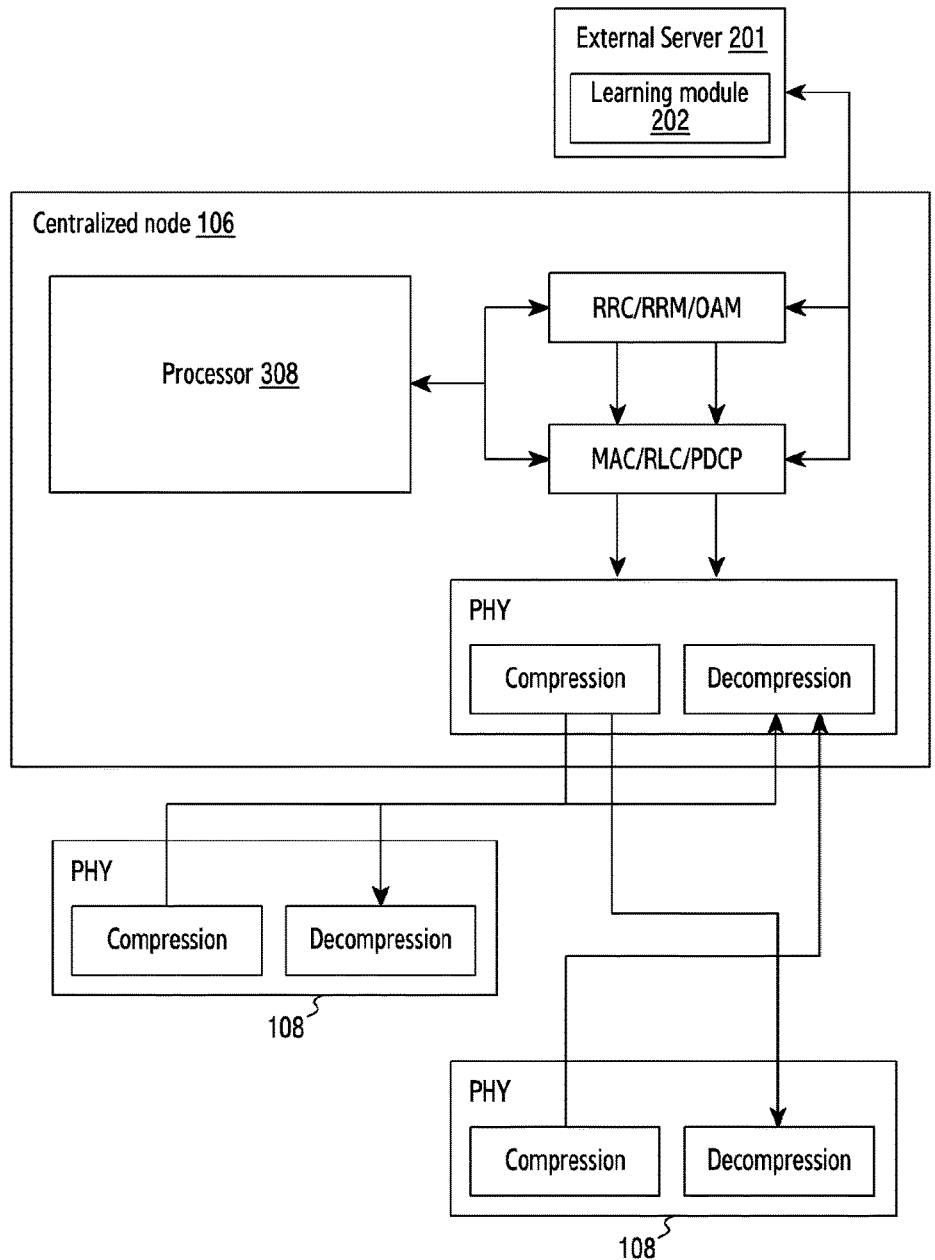
[Fig. 5]
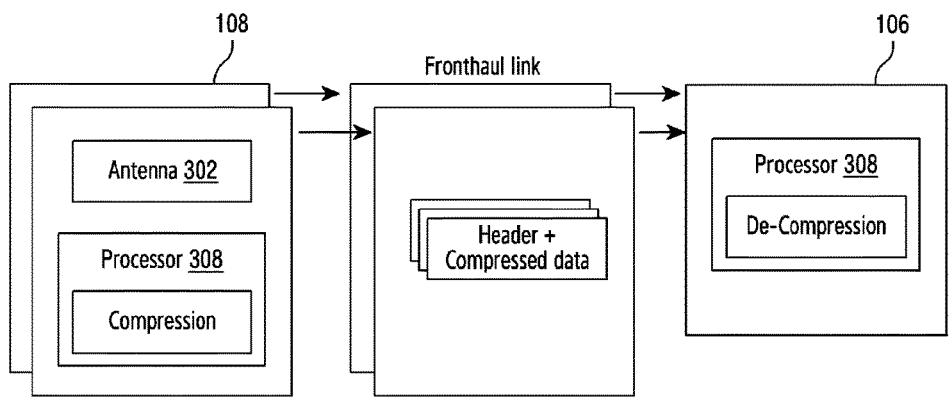

[Fig. 6A]

| UE | Max value | Min value |
|---|---|---|

[Fig. 6B]

| UE-1 | Max value | Seq number | Sector number |
|---|---|---|---|
| | Compressed Payload | | |

[Fig. 6C]

| UE-1 | Max value | Seq number | Ant number | Sector number |
|---|---|---|---|---|
| | Parameter-X | Parameter-Y | Start PRB | PRB Length |
| | Used Qos | Min Value | Distribution | Used CQI |
| | Compressed Payload | | | |

[Fig. 7]

| QCI | Resource Type | Priority | Packet Delay Budget (NOTE 1) | Packet Error Loss Rate (NOTE 2) | Example Services |
|---|---|---|---|---|---|
| 1 (NOTE 3) | GBR | 2 | 100 ms | $10^{-2}$ | Conversational Voice |
| 2 (NOTE 3) | | 4 | 150 ms | $10^{-3}$ | Conversational Video (Live Streaming) |
| 3 (NOTE 3) | | 3 | 50 ms | $10^{-3}$ | Real Time Gaming |
| 4 (NOTE 3) | | 5 | 300 ms | $10^{-6}$ | Non-Conversational Video (Buffered Streaming) |
| 5 (NOTE 3) | Non-GBR | 1 | 100 ms | $10^{-6}$ | IMS Signalling |
| 6 (NOTE 4) | | 6 | 300 ms | $10^{-6}$ | Video (Buffered Streaming) TCP-based(e.g., www, e-mail, chat, ftp, p2p file sharing, progressive video, etc.) |
| 7 (NOTE 3) | | 7 | 100 ms | $10^{-3}$ | Voice, Video (Live Streaming) Interactive Gaming |
| 8 (NOTE 5) | | 8 | 300 ms | $10^{-6}$ | Video (Buffered Streaming) TCP-based(e.g., www, e-mail, chat, ftp, p2p file sharing, progressive video, etc.) |
| 9 (NOTE 6) | | 9 | | | |

[Fig. 8]

| CQI | QoS-Packet Error Rate (PER) | Number of Compression Levels |
|---|---|---|
| Good | $10^{-6} < PER < 10^{-3}$ | 2 |
| Bad | $10^{-6} < PER < 10^{-3}$ | 1 or 2 |
| Good | $< 10^{-6}$ | 1 |
| Bad | $< 10^{-6}$ | 1 |

[Fig. 9A]
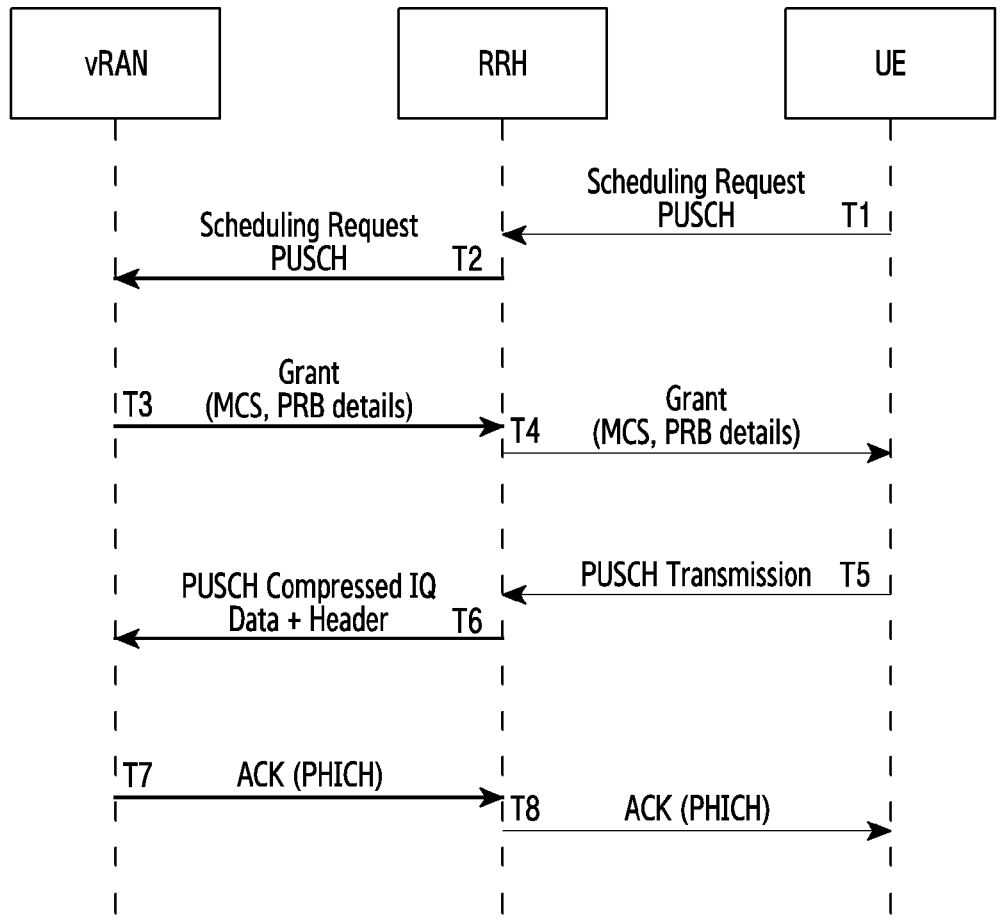
[Fig. 9B]
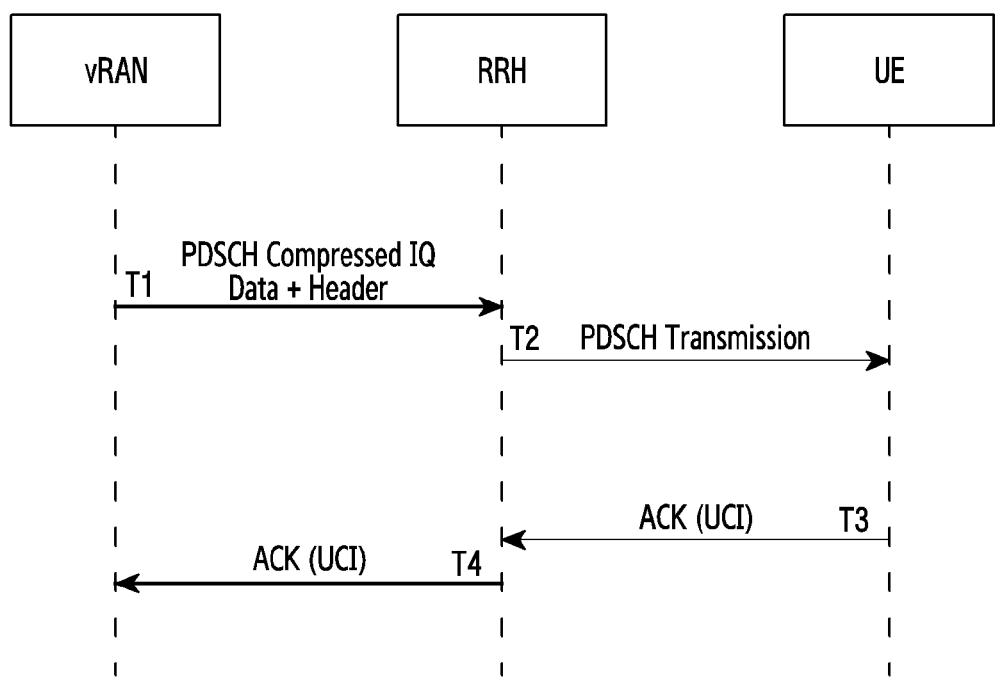

[Fig. 10]
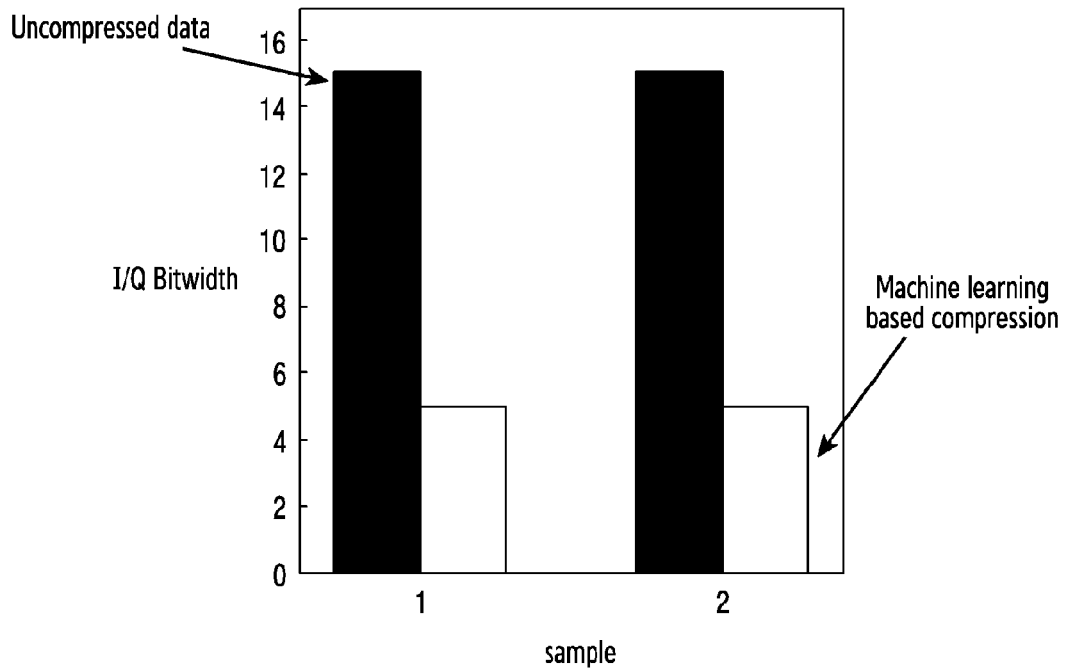
[Fig. 11A]
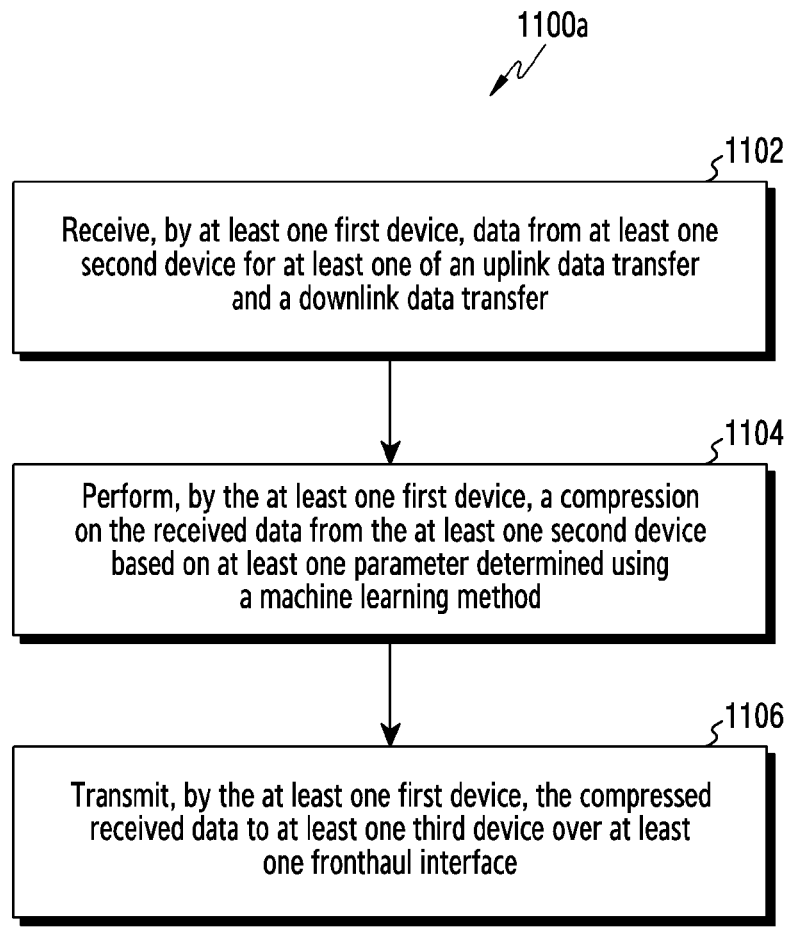

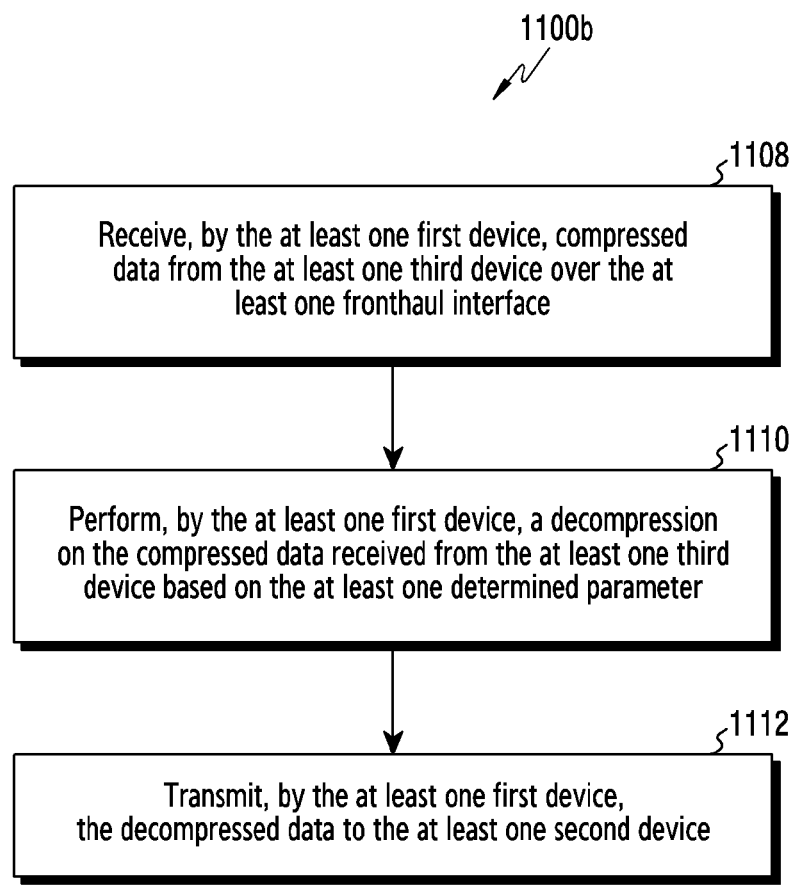
[Fig. 11B]

METHODS AND SYSTEMS FOR REDUCING FRONTHAUL BANDWIDTH IN A WIRELESS COMMUNICATION SYSTEM

TECHNICAL FIELD

The present disclosure relates to the field of wireless networks and more particularly to reducing fronthaul bandwidth in a wireless network.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), nonorthogonal multiple access (NOMA), and sparse code multiple access (SCMA) as an advanced access technology have been developed.

DISCLOSURE OF INVENTION

Technical Problem

The principal object of the embodiments herein is to disclose methods and systems for reducing fronthaul bandwidth during data transfer between at least one radio node and at least one centralized node in a wireless network.

Another object of the embodiments herein is to disclose methods and systems for determining parameters specific to at least one User Equipment (UE) using a machine learning method.

Another object of the embodiments herein is to disclose methods and systems for transferring the data between the at least one radio node and the at least one centralized node over a fronthaul link by performing a compression on the data using the parameters that are determined using the machine learning method.

Another object of the embodiments herein is to disclose methods and systems for performing a decompression on the compressed data using the parameters that are determined using the machine learning method.

Solution to Problem

Accordingly, the embodiments herein provide methods and systems for reducing fronthaul bandwidth in a wireless network. A method disclosed herein includes receiving, by at least one first device, data from at least one second device for at least one of an uplink data transfer and a downlink data transfer. The method includes performing, by the at least one first device, a compression on the received data from the at least one second device based on at least one parameter, wherein the at least one parameter is determined using machine learning. The method includes transmitting, by the at least one first device, the compressed received data to at least one third device over at least one fronthaul interface.

The method disclosed herein further includes receiving, by the at least one first device, compressed data from the at least one third device over the at least one fronthaul interface. The method further includes performing, by the at least one first device, a decompression on the compressed data received from the at least one third device based on the at least one determined parameter. The method further includes transmitting, by the at least one first device, the decompressed data to the at least one second device.

Accordingly, embodiments herein provide a device in a wireless network. The device is configured to receive data from at least one second device for at least one of an uplink data transfer and a downlink data transfer. The device is further configured to perform a compression on the received data from the at least one second device based on at least one parameter, wherein the at least one parameter is determined using machine learning. The device is further configured to transmit the compressed received data to at least one third device over at least one fronthaul interface.

The device is further configured to receive compressed data from the at least one third device over the at least one fronthaul interface. The device is further configured to perform a decompression on the compressed data received from the at least one third device based on the at least one determined parameter. The device is further configured to transmit the decompressed data to the at least one second device.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and the example embodiments herein include all such modifications.

Advantageous Effects of Invention

This disclosure provides methods and systems for reducing fronthaul bandwidth in a wireless communication system.

Embodiments herein disclose methods and systems for reducing fronthaul bandwidth in a wireless network.

Embodiments herein disclose methods and systems for determining at least one parameter specific to at least one User Equipment (UE) using a machine learning method for performing a compression and a decompression.

Embodiments herein disclose methods and systems for transferring data over a fronthaul link during an uplink data transfer and a downlink data transfer by performing a compression on the data using the parameters that are determined using the machine learning method.

BRIEF DESCRIPTION OF DRAWINGS

Embodiments herein are illustrated in the accompanying drawings, throughout which like reference letters indicate corresponding parts in the various figures. The embodiments herein will be better understood from the following description with reference to the drawings, in which:

FIGS. 1A-1C depict a wireless network, according to embodiments as disclosed herein;

FIGS. 2A and 2B depict a learning module for determining parameters to perform a compression and a decompression, according to embodiments as disclosed herein;

FIG. 3 is a block diagram illustrating various components of a centralized node and a radio node, according to embodiments as disclosed herein;

FIGS. 4A and 4B are example diagrams depicting transferring of data over a fronthaul link in the wireless network with reduced fronthaul bandwidth, according to embodiments as disclosed herein;

FIG. 5 is an example diagram depicting the compression performed on the data to transfer over the fronthaul link, according to embodiments as disclosed herein;

FIGS. 6A-6C depict header formats used for packing compressed data, according to embodiments as disclosed herein;

FIG. 7 is an example table depicting maintained parameters history, which can be used for determining the parameters for performing the compression and the decompression, according to embodiments as disclosed herein;

FIG. 8 is an example table depicting the hierarchical compression performed based on a Channel Quality Indicator (CQI) and Quality of Service (QoS)-Packet Error Rate (PER), according to embodiments as disclosed herein;

FIG. 9A is an example sequence diagram depicting the compression performed during an uplink transfer of the data over the fronthaul link, according to embodiments as disclosed herein;

FIG. 9B is an example sequence diagram depicting the compression performed during a downlink transfer of the data over the fronthaul link, according to embodiments as disclosed herein;

FIG. 10 is an example graph depicting a bandwidth comparison for a transfer of uncompressed data and a transfer of the compressed data (using the parameters that are determined using the machine learning method) over the fronthaul link, according to embodiments as disclosed herein;

FIG. 11A is a flow diagram depicting a method for performing the compression to transfer the data over the fronthaul link by reducing the fronthaul bandwidth, according to embodiments as disclosed herein; and FIG. 11B is a flow diagram depicting a method for performing the decompression using the parameters that are determined using the machine learning method, according to embodiments as disclosed herein.

BEST MODE FOR CARRYING OUT THE INVENTION

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

In a wireless network, radio nodes can be connected to at least one centralized node for providing wireless coverage to a larger area. Examples of the radio nodes can be, but not limited to, Remote Radio Units (RRUs), Remote Radio Heads (RRHs), and so on. Examples of the centralized node can be, but not limited to, a Base Band Unit (BBU), a Virtualized-Radio Access Network (V-RAN), a Cloud-RAN (C-RAN), and so on. The radio nodes can be connected to the at least one centralized node via fronthaul links. A common public radio interface (CPRI) may be used an interface for connecting the radio nodes to the at least one centralized node via the fronthaul links.

The at least one centralized node can receive data from a core network and can forward the received data to the radio nodes via the fronthaul links, wherein the radio nodes can further forward the data to User Equipments (UEs)/wireless devices (can be referred as a downlink data transfer). The at least one radio node can receive the data from the UEs and forward the data to the at least one centralized node via the fronthaul links for forwarding the data to the core network (can be referred as an uplink data transfer). Thus, the uplink data transfer and the downlink data transfer can be performed via the fronthaul links. However, the fronthaul links may be capacity constrained links, which may increase fronthaul bandwidth requirements in response to increased data rates between the radio nodes and the at least one centralized node. Further, due to the capacity constrained fronthaul links, the at least one centralized node/the radio nodes may receive the multiple data packets with jitters. In addition, the capacity constrained fronthaul links may result in packet drop and bit error rate (BER) degradations.

In order to reduce the fronthaul bandwidth requirements, the radio nodes and the at least one centralized node may perform a compression for the uplink data transfer and the downlink data transfer via the fronthaul links. In conventional approaches, the compression may be performed using at least one of Lloyd techniques, Huffman techniques, CPRI compression techniques, and so on. However, such type of compression techniques may be computationally intensive.

Referring now to the drawings, and more particularly to FIGS. 1A through 11B, where similar reference characters denote corresponding features consistently throughout the figures, there are shown example embodiments.

FIGS. 1A-1C depict a wireless network 100, according to embodiments as disclosed herein. The wireless network 100 referred herein can be at least one of a Centralized Radio Access Network (RAN) network, a cloud RAN network, an Open-RAN network (O-RAN), a virtualized RAN network, a Long Term Evolution (LTE)/4G network, an LTE advanced network, a Fifth Generation/New radio (5G) network, or the like.

The wireless network 100 includes a core network 102, one or more User Equipments (UEs) 104, one or more centralized nodes 106, and one or more radio nodes 108.

The core network 102 can be at least one of an Evolved Packet Core (EPC) network, a 5G Core (5G) network, and so on. The core network 102 can be connected to the centralized nodes 106 through a backhaul link and to an external data network. Examples of the external data network can be, but not limited to, the Internet, a Packet Data Network (PDN), an Internet Protocol (IP) Multimedia Core Network Subsystem, and so on. The core network 102 can be configured to connect at least one UE 104 to an external data network and/or another UE.

The UE(s) 104 referred herein can be a device with radio frequency (RF) processing capabilities. Examples of the UE 104 can be, but not limited to, a mobile phone, a smartphone, a tablet, a phablet, a personal digital assistant (PDA), a laptop, a computer, a wearable computing device, a vehicle infotainment device, an Internet of Things (IoT) device, a Wireless Fidelity (Wi-Fi) router, a USB dongle, or any other processing devices capable of using the wireless network 100. The UE 104 can connect to at least one radio node 108 for communicating with the external data network. The UE 104 can be connected to the at least one radio node 108 through an air interface.

The centralized node 106 can be a node configured to perform base-band operations on receiving radio signals/data from the at least one radio node 108 and the core network 102. In an embodiment, the centralized node 106 can be at least one of a Base Band Unit (BBU), a Virtualized-Radio Access Network (V-RAN) and a Cloud-RAN (C-RAN), and so on as illustrated in FIG. 1B. In an embodiment, the centralized node 106 can be at least one of an eNodeB (eNB), a gNodeB (gNB), and so on, as illustrated in FIG. 1C. The centralized node 106 can be connected to the core network 102 through the backhaul link. The centralized node 106 can be remotely located from the at least one radio node 108. The centralized node 106 can be connected to the at least one radio node 108 through a fronthaul link/fronthaul interface. The fronthaul link can be any communication medium that has an appropriate bandwidth for communication between the centralized node 106 and the at least one radio node 108. Examples of the fronthaul link can be, but not limited to, a wired communication link, a wireless communication link, a fiber optic cable, an Ethernet, an intranet, the Internet, and so on. Embodiments herein use the terms such as "centralized node", "BBU", "C-RAN", "V-RAN", "eNB", "gNB", and so on interchangeably to refer to a node that is connected to the core network 102 through the backhaul link and to the at least one radio node 108 through the fronthaul link.

The radio node 108 can be a node configured to provide wireless broadband access to the external data network for the at least one UE 104 present within a coverage area of the radio node 108. In an embodiment, the radio node 108 can be, but not limited to, a Remote Radio Unit (RRU), a Remote Radio Head (RRH), and so on as illustrated in FIG. 1B. In an embodiment, the radio node 108 can be a relay node such as, but not limited to, a relay eNB, a relay gNB, and so on. The radio node 108 can be connected to the at least one centralized node 106 through the fronthaul link. In an example, the radio node 108 like RRU/RRH can be connected to the at least one centralized node 106 like BBU/V-RAN/C-RAN, through the fronthaul link as illustrated in FIG. 1B. In an example, the radio node 108 like eNB/gNB can be connected to the at least one centralized node 106 like eNB/gNB through an X2 interface via the fronthaul link, as illustrated in FIG. 1C. The radio node 108 can be connected to the at least one UE 104 through the air interface. Embodiments herein use terms such as "RRH", "RRU", "relay eNB", "relay gNB", "radio node", and so on interchangeably to refer to a node that is connected to the at least one centralized node 106 through the fronthaul link and capable of transmitting/receiving radio signals to/from the at least one centralized node 106.

The centralized node 106 can be configured to receive the data (that is received from the external data network) from the core network 102 and compress the data received from the core network 102. The data referred herein may refer to at least one service session. Examples of the service session can be, but is not limited to, a voice service session, a live streaming service session, a real time gaming service session, a buffered streaming service session, a Transport Control Protocol (TCP) based session (for example; an email, a messaging service, a file transferring service, and so on), an Internet Protocol (IP) Multimedia Subsystem (IMS) service, and so on. The centralized node 106 further transfers the compressed data to the radio node 108 through the fronthaul link (hereinafter referred as a downlink data transfer). The radio node 108 can be configured to receive the data from the UE(s) 104 and perform the compression on the data received from the UE 104. The radio node 108 further transfers the compressed data to the centralized node 106 through the fronthaul link (hereinafter referred as an uplink data transfer). Thus, the data transferred through the fronthaul link by at least one of the centralized node 106 and the radio node 108 may always be compressed.

The centralized node 106 can also be configured to receive the compressed data from the radio node 108 through the fronthaul link and decompress the compressed data. The centralized node 106 further transfers the decompressed data to the core network 102 (the uplink data transfer). The radio node 108 can also be configured to receive the compressed data from the centralized node 106 through the fronthaul link and decompress the compressed data. The radio node 108 further transfers the decompressed data to the at least one UE 104 (the downlink data transfer).

In an embodiment, the centralized node 106 and the radio node 108 can be configured to perform the compression and the decompression during both the downlink data transfer and the uplink transfer based on parameters of the UE 104. Examples of the parameters can be, but not limited to, a resource type of a bearer, bearer Quality of Service (QoS), resource allocation information, channel QoS information, parameters derived based on Probability Density Function (PDF), central moments of a UE distribution function, delay tolerance requirements, QoS-Packet Error Rate (QoS-PER), QoS class identifier (QCI), Channel Quality Indicator (CQI), and so on. Examples of the resource type of the bearer can be, but not limited to, a Guaranteed Bit Rate (GBR) resource type, a non-GBR resource type, and so on. Examples of the bearer QoS can be, but not limited to, instantaneous Signal to interference plus noise ratio (SINR), average SINR, delay, Block Error Rate (BLER), and so on. Examples of the resource allocation information can be, but not limited to, Physical Resource Blocks (PRBs) information, Modulation and Coding Scheme (MCS) information, or the like. Examples of the parameters derived based on the PDF can be, but not limited to, positive maximum (max), positive minimum (min), negative max, negative min, and so on. Example of the central moments of the UE distribution function can be, but not limited to, mean, variance, median, and so on.

In an embodiment, the centralized node 106 determines/selects the parameters of the UE for performing the compression and the decompression using at least one learning method. Examples of the learning method can be, but is not limited to, a machine learning method, a deep learning method, an Artificial Intelligence (AI) learning method, and so on. Performing the compression and decompression based on the parameters determined using the learning methods may reduce fronthaul bandwidth requirements for transferring the data between the centralized nodes 106 and the radio nodes 108.

FIGS. 1A-1C show exemplary elements of the wireless network 100, but it is to be understood that other embodiments are not limited thereon. In other embodiments, the wireless network 100 may include less or a greater number of elements/units. Further, the labels or names of the units are used only for illustrative purpose and does not limit the scope of the embodiments herein. One or more units can be combined together to perform same or substantially similar function in the wireless network 100.

FIGS. 2A and 2B depict a learning module 202 for determining the parameters to perform the compression and the decompression, according to embodiments as disclosed herein.

In an embodiment, the centralized node 106 includes the learning module 202 for determining the parameters of the UE to perform the compression and the decompression as illustrated in FIG. 2A. The centralized node 106 provides the determined parameters to the at least one radio node 108 for performing the compression and the decompression.

In an embodiment, an external server 201 (a standalone server, a cloud server, or the like) can include the learning module 202 for determining the parameters of the UE to perform the compression and the decompression. In such a case, the centralized node 106 communicates with the learning module 202 of the external server 201 to access the determined parameters of the UE. The centralized node 106 further provides the determined parameters to the at least one radio node 108 for performing the compression and the decompression.

The learning module 202 can be configured to determine/select the parameters of the UE for performing the compression and the decompression based on at least one of a machine learning method, a deep learning method, an AI learning method, and so on. Embodiments herein are further explained considering the machine learning method for determining the parameters, but it may be obvious to a person skilled in the art that any other learning methods may be considered.

For determining the parameters, the learning module 202 continuously receives the parameters of the UE 104 from the radio node 108. Examples of the parameters related to the UE 104 can be at least one of the resource type of the bearer (for example: the GBR, the non-GBR or the like), the bearer QoS (for example: the instantaneous SINR, the average SINR, the delay, the BLER, or the like), the PDF functions, (for example: the positive max, the positive min, the negative max, the negative min, or the like), the central moments of the UE distribution function (for example; the mean, the variance, the median or the like), the channel QoS, the CQI (for example; uplink quality, downlink quality, or the like), the resource allocation information (for example; the PRBs information), the QCI, and so on. The received parameters can correspond to each Cell-Radio Network Temporary Identifier (C-RNTI). The learning module 202 stores the received parameters in the memory 310/external database, thereby maintaining a history of the parameters of the UE.

The learning module 202 further receives a scheduling request from the radio node 108 for the parameter of the UE. On receiving the scheduling request, the learning module 202 receives the parameters of the UE from the at least one radio node 108 at a current instance of time. The learning module 202 computes and assigns the at least one weight of each received parameter of the UE based on the maintained history. In an embodiment, the learning module 202 computes the at least one weight of each parameter of the UE using at least one weight previously assigned to each parameter. In an example herein, the learning model 202 computes a weight for a parameter based on the previous weight assigned to that parameter as:

$$\text{Weight } W\_(T) = \alpha\_(T) * W\_(T-1) + \sigma\_(T) * U\_(T)$$

wherein, '$W\_(T)$' can be the weight assigned to the parameter, '$W\_(T-1)$' can be the weight that is previously assigned to the parameter, '$\alpha\_(T)$' can be a transition model that is applied to the previous weight/state '$W\_(T-1)$', and '$\sigma\_(T)$' can be a control input model that is applied to a control input '$U\_(T)$'.

In an embodiment, the learning module 202 can compute the at least one weight of each parameter using a linear regression model. In an example herein, according to the linear regression model, the learning module 208a can compute the weight of the parameter using the below equation:

$$W\_(T) = \beta\_1 W\_(T-1) + \text{Constant}$$

wherein, '$\beta$' can be an integer value.

In an embodiment, the learning module 202 can compute the at least one weight of each parameter using an auto regression model for a first order prediction. In an example herein, the linear module 202 can compute the weight of the parameter using the auto regression model for the first order prediction as:

$$W\_(T) = \beta\_0 + \beta\_1 W\_(T-1) + \varepsilon\_T$$

In an embodiment, the learning module 202 can assign the at least one weight to each parameter using an auto regression model for a second order prediction. In an example herein, the linear module 208a can assign the weight to the parameter using the auto regression model for the second order prediction as:

$$W\_(T) = \beta\_0 + \beta\_1 W\_(T-1) + \beta\_1 W\_(T-2) + \varepsilon\_T$$

wherein, '$\beta$' values can be different for different parameters.

The learning module 202 further determines/selects the parameters and associated value for performing the compression and the decompression based on the at least one weight/value assigned to each parameter of the UE (that are received from the at least one radio node 108 on receiving the scheduling request).

FIG. 3 is a block diagram illustrating various components of the centralized node 106 and the radio node 108, according to embodiments as disclosed herein. The centralized node 106 and the radio node 108 includes antennas 302, RF transceivers 304, a transmission (Tx) processing circuitry 306a, a receiver (Rx) processing circuitry 306b, a processor 308, an interface 310, and a memory 312.

The RF transceivers 304 can be configured to receive incoming RF signals from the antennas 302, wherein the RF signals can be transmitted from at least one external entity (at least one of the UE 104, the centralized node 106/the radio node 108, the core network 102, or the like). The received RF signals herein may correspond to at least one of the compressed data, the parameters of the UE, or the like. The RF transceivers 304 may generate Intermediate Frequency (IF) signals/baseband signals by down converting the received RF signals. The RF transceivers 304 may provide the generated IF signals to the Rx processing circuitry 306b.

The Rx processing circuitry 306b can be configured to process the received IF signals by performing at least one of filtering, decoding, digitizing the IF signals (conversion of analog to digital form), and so on. The RX processing circuitry 306b provides the processed IF signals to the processor 308 for further processing.

The Tx processing circuitry 306a can be configured to receive analog/digital data from the processor 308, wherein the received data herein may be the compressed data. The Tx processing circuitry 306a generates the IF signals by performing at least one of encoding the received data, multiplexing the received data, digitizing the received data, and so on. The Tx processing circuitry 306a further provides the generated IF signals to the RF transceivers 304. The RF transceivers 304 further up-converts the received IF signals to the RF signals and transmits the RF signals to the at least one external entity (the UE 204, the core network 102, the centralized node 106/the radio node 108, or the like) via the antennas 302.

The processor 308 can be at least one of a single processer, a plurality of processors, multiple homogeneous or heterogeneous cores, multiple Central Processing Units (CPUs) of different kinds, microcontrollers, special media, and other accelerators. The processor 308 can be configured to compress the data, before transferring the data through the fronthaul. In an example, the processor 308 of the centralized node 106 receives the data corresponding to the at least one service session for the UE 104 from the core network 102 and compresses the received data, before transferring the data to the radio node 108 through the fronthaul link, which further forwards the received data to the UE 104. In an example, the processor 308 of the radio node 108 receives the data corresponding to the at least one service session from the UE 104 and compresses the received data, before transferring the data of the UE 104 to the centralized node 106 through the fronthaul link.

In an embodiment, the processor 308 can perform the compression based on the parameters that are determined/selected using the machine learning method. The processor 308 can communicate with the learning module 202 and receive the parameters that are determined for the compression.

In an embodiment, the processor 308 can perform an adaptive and dynamic compression on the data based on the parameters that are determined using the machine learning method. In an embodiment, the processor 308 can perform a multi-level compression/hierarchical compression on the data based on the parameters that are determined using the machine learning method. The compression can include at least one of a loss-less compression method and a lossy compression method.

For performing the compression, the processor 308 segregates the received data based on the parameters determined using the machine learning method. In an embodiment, the resource allocation information may be considered as the parameter for segregating the received data. The received data may correspond to Inphase and Quadrature (IQ) samples, wherein each sample has real and imaginary components. The processor 308 segregates the IQ samples based on the parameters determined using the machine learning method (for example: the resource allocation information). The processor 308 normalizes the segregated IQ samples using the determined at least one parameter and the associated value. The processor 308 normalizes the IQ samples by dividing the segregated IQ samples using the at least one parameter as a division factor, wherein the parameter has been determined using the machine learning. The processor 308 thereafter multiples the normalized IQ samples with a desired resolution value. The desired resolution value can be determined/selected based on the compression rate determined for the compression. In an embodiment, the processor 308 determines the compression rate for the compression based on the parameters that are determined using the machine learning method. The compression rate may include at least one of a lesser compression rate, a higher compression rate, and so on. In an example herein, performing the compression using the lesser compression rate involves encoding 16-bit IQ samples of the received data as a 12-bit number, wherein the 12 can be the desired resolution value. In an example herein, performing the compression using the higher compression rate involves encoding the 16-bit IQ samples of the received data as a 7 or 8-bit number, wherein 7 or 8 can be the desired resolution value. The multiplied IQ samples with the desired resolution value may correspond to the compressed data.

After compressing, the processor 308 further packs the compressed IQ samples of the received data using a header of a suitable header format. The processor 308 transfers the packed compressed data over the fronthaul link. In an embodiment, the processor 308 may use a first header format if a number of radio nodes 108 are less in the wireless network 100 and a direct fronthaul link exists between the centralized node 106 and the radio node 108. The first header format includes information about parameters such as, but not limited to, a maximum value, a minimum value and so on derived from the PDF.

In an embodiment, the processor 308 may use a second header format, if the number of radio nodes 108 are more and a plurality of routers/relay nodes exists between the centralized node 106 and the radio node 108. The second header format includes information about the parameters such as, but not limited to, a maximum value derived from the PDF, a sequence number, a sector number, a compressed payload, and so on.

In an embodiment, the processor 308 may use a third header format, based on the complexity of the wireless network 100. The third header format includes information about the parameters used for the compression, such as, but not limited to, a maximum value derived from the PDF, a sequence number, an antenna number, a sector number, a parameter-X, a parameter-Y, a start PRB, a PRB length, used QoS, a minimum value derived based on the PDF, a UE distribution function, used CQI, a compressed payload, and so on. The sequence number can be used in the header to address an out of order reception of packets of data at a receiver (can be at least one of the centralized node 106 and the radio node 108) for decompression. The antenna number can be used to provide information about reception of the packets of data/signal that can leverage receive spatial diversity, wherein all the received packets of data may be compressed before combing the data to transfer through the fronthaul using the antenna 302. The sector number can be used to provide information about multiple component carriers of Carrier Aggregation (CA) that can be supported by at least one of the centralized node 106 and the radio node 108. Further, each sector number refers to each component carrier. The parameter 'X' and the parameter 'Y' can be reserved spaces. In an example, the reserved spaces can be used for the central moments of the UE distribution function such as, but not limited to, mean, variance, and median values of the IQ data. The start PRB defines a range to be used for the parameters such as QoS, CQI, and so on. The used QoS provides information about higher layer QoS parameters used to achieve higher compression. The maximum value, the minimum value, and the UE distribution function can be used to identify a level of compression. The used CQI provides information about the channel quality of the UE under compression.

In an embodiment, the processor 308 can perform the multi-level compression based on the parameters that are determined using the machine learning. During the multi-level compression, the processor 308 performs the compression at a first level based on the parameters that are determined using the machine learning method (as illustrated above) and performs the compression at second and succeeding levels using loss-less compression methods (for example; Huffman coding, or the like).

Consider an example scenario, wherein the processor 308 receives the data from the plurality of UEs 104/users. The processor 308 segregates the IQ samples of the received data, wherein the IQ samples can be 16 bit data types of a Q15 format (I and Q samples lie from 10,000 to 32768). In an example herein, consider that the processor 308 receives the maximumvalue/function (max function) of the IQ samples derived based on the PDF function as the parameter from the learning module 202 for performing the compression. On receiving the parameter for performing the compression, the processor 308 computes a max function for a jth user/UE after segregating the IQ samples. The max function can be a 'j_max(abs(I_j), abs(Q_j))'. The 'j_max' can be a maximum absolute value of the jth user/UE. After calculating the max function, the processor 308 normalizes all the IQ samples of the all the jth UE with the max function 'j_max'. In an example herein, the IQ samples can be normalized by dividing the IQ samples using the max function (i.e. 10000/32678 to 32768/32768 which can be equal to 0.30517 to 1). The processor 308 further multiplies the normalized samples with (2^{M_j}), wherein 'M_j' can be a desired resolution for a given barrier. In an example herein, the 'M_j' can be considered as 7 to achieve 50% compression and the (2^{M_j}−1) can be 128 if the value of the 'M_j' is 7. The multiplication of the normalized samples involves 0.30517*128 to 1*128, which results in 39 to 128. Thus, the received data may be reduced from 16-bit to 8-bit. Also, the processor 308 can perform a successive level of loss-less compression to further reduce the bits of the received data as well as for greater compression ratio based on the parameters that are determined using the machine learning method. The processor 208 further transmits the value of the max function 'j_max" as an overhead over the fronthaul link. The processor 308 further repeats actions of normalizing the IQ samples and multiplying the normalized IQ samples for all the UEs/users similar to the jth user. After completing the actions of normalizing the IQ samples and multiplying the normalized IQ samples for all the UEs/users, the processor 308 packs all the multiplied IQ samples with the suitable header format. The processor 308 transfers the packed IQ samples over the fronthaul link, wherein the packed IQ samples may correspond to the compressed data.

The processor 308 can be further configured to decompress the compressed data received through the fronthaul link. In an example herein, the processor 308 of the centralized node 106 can receive the compressed data from the radio node 108 through the fronthaul link and decompress the received compressed data. The processor 308 further transfers the decompressed data to the core network 102. In an example herein, the processor 308 of the radio node 108 can receive the compressed data from the centralized node 106 through the fronthaul link and decompress the received compressed data. The processor 308 further transfers the decompressed data to the UE 104.

In an embodiment, the processor 308 decompresses the compressed data based on the parameters that are determined using the machine learning method. The processor 308 communicates with the leaning module 202 to access the parameters that are determined using the machine learning method.

For performing the decompression, the processor 308 unpacks the compressed data using the compressed payload.

The processor 308 multiplies the IQ samples of the compressed data with the desired resolution and normalizes the IQ samples using the at least one parameter that is determined using the machine learning as the division factor. The normalized IQ samples may correspond to the decompressed data.

Consider an example herein, wherein the processor 308 receives the compressed data for the plurality of users/UEs 104. In such a scenario, the processor 308 multiplies all the IQ samples of the data of the jth user/UE with the max function 'j_max' considering that M_j as the desired resolution. The processor 308 thereafter normalizes the multiplied IQ samples by satisfying the parameters that are determined using the machine learning method. The processor 308 repeats actions of multiplying the IQ samples of the data and normalizing the multiplied IQ samples for all the users/UEs present in the network 100.

The interface 310 can be configured to enable the centralized node 106/radio node 108 to communicate with at least one external entity (such as, radio node 108/centralized node 106, the at least one UE 104/the core network 102).

The memory 312 can store at least one of the parameters that are determined using the machine learning, the compression rate, information about at least one of the UE 104, the radio node 108/the centralized node 106, or the like, the compressed data, the decompressed data, and so on. The memory 312 may include one or more computer-readable storage media. The memory 312 may include non-volatile storage elements. Examples of such non-volatile storage elements may include magnetic hard discs, optical discs, floppy discs, flash memories, or forms of electrically programmable memories (EPROM) or electrically erasable and programmable (EEPROM) memories. In addition, the memory may, in some examples, be considered a non-transitory storage medium. The term "non-transitory" may indicate that the storage medium is not embodied in a carrier wave or a propagated signal. However, the term "non-transitory" should not be interpreted to mean that the memory is non-movable. In some examples, the memory can be configured to store larger amounts of information than the memory. In certain examples, a non-transitory storage medium may store data that can, over time, change (e.g., in Random Access Memory (RAM) or cache).

FIG. 3 shows exemplary elements of the centralized node 106 and the radio node 108, but it is to be understood that other embodiments are not limited thereon. In other embodiments, the centralized node 106 and the radio node 108 may include less or a greater number of elements/units. Further, the labels or names of the units are used only for illustrative purpose and does not limit the scope of the embodiments herein. One or more units can be combined together to perform same or substantially similar function in the centralized node 106 and the radio node 108.

FIGS. 4A and 4B are example diagrams depicting the transferring of the data over the fronthaul link in the wireless network 100 with the reduced fronthaul bandwidth, according to embodiments as disclosed herein. Embodiments herein are further explained considering that the BBU 106 as an example of the centralized node 106 and the RRH 106 as an example of the radio node 108.

Consider an example scenario, wherein the UEs 104 transfer the data to the respectively connected RRHs 108 (for example herein, a first RRH 108 and a second RRH 108) in order to transfer the data to the external data network. In such a case, the first and second RRHs 108 perform the compression (at a physical (PHY) layer) on the received data, before transferring the data to the BBU 106 through the fronthaul link. The first and second RRHs 108 send the scheduling request to the BBU 106 for receiving the parameters that are required for compressing the data of the UEs 104.

In an embodiment, on receiving the scheduling request from the first and second RRHs 108, the BBU 106 receives the parameters of the UEs at the current instance of time and determines/selects the parameters for performing the compression using the machine learning method. For determining the parameters, the BBU 106 assigns the at least one weight to each parameter and determines the parameters for performing the compression based on the at least one weight assigned to each parameter. In an embodiment, the BBU 106 can assign the at least one weight to each parameter based on the maintained history of the parameters of the UEs 104. In an embodiment, the BBU 106 can also assign the at least one weight to each parameter based on at least one of the linear regression method, the auto regression method for the first order prediction, the auto regression method for the second order prediction, and so on. The BBU 106 transfers the determined parameters to the first and second RRHs 108 in response to the received scheduling request.

In an example herein, transferring of the determined parameters from the BBU 106 to the first and second RRHs 108 involves transferring of the data from a Radio Resource Control (RRC)/Radio Resource Management (RRM)/Operations, administration and management (OAM) layer of the BBU 106 to a Medium Access Layer (MAC)/Radio Link Control (RLC)/Packet Data Convergence Protocol (PDCP) layer of the BBU 106 and to the PHY layer of the first and second RRHs 108.

In an embodiment, on receiving the scheduling request from the first and second RRHs 108, the BBU 106 receives the parameters of the UEs at the current instance of time and forwards the received parameters of the UEs to the learning module 202 of the external server 201 as illustrated in FIG. 4B. On receiving the parameters of the UEs 104 from the BBU 106, the learning module 202 of the external server 201 determines the parameters for performing the compression. Examples of the parameters related to the UE 104 can be at least one of the resource type of the bearer (for example: the GBR, the non-GBR or the like), the bearer QoS (for example: the instantaneous SINR, the average SINR, the delay, the BLER, or the like), the PDF functions, (for example: the positive max, the positive min, the negative max, the negative min, or the like), the central moments of the UE distribution function (for example; the mean, the variance, the median or the like), the channel QoS, the CQI (for example; uplink quality, downlink quality, or the like), the resource allocation information (for example; the PRBs information), the QCI, and so on. The learning module 202 of the external server 201 provides the determined parameters to the BBU 106, which further transfers the determined parameters to the first and second RRHs 108 in response to the received scheduling request.

On receiving the parameters that have been determined using the machine learning method, the first and second RRHs 108 perform the compression (at the PHY layer) on the data of the UEs 104 by satisfying the requirements of the received parameters. In an embodiment, the first and second RRHs 108 can perform at least one of the single level compression, the multi-level compression/hierarchical compression, and so on. The multi-level compression may include at least one of the lossless compression, and the lossy compression. The first and second RRHs 108 transfer the compressed data to the BBU 106 through the fronthaul link. In an example herein, transferring of the compressed data from the first and second RRHs 108 to the BBU 106 involves transferring of the compressed data from the PHY layer of the first and second RRHs to the PHY layer of the BBU 106. Further, at the BBU 106, the compressed data may be transferred from the PHY layer to the MAC/RLC/PDCP layer, and further transferred to the RRC/RRM/OAM layer.

On receiving the compressed data from the first and second RRHs 108, the BBU 106 decompresses the received compressed data using the parameters that are determined using the machine learning method. The BBU 106 further transfers the decompressed data of the UEs 104 to the core network 102, which further transfers the data of the UEs 104 to the external data network.

Consider an example scenario, wherein the BBU 106 receives the data from the external data network through the core network 102 in order to transfer the data to the UEs 104. In such a case, the BBU 106 compresses the received data. For performing the compression, the BBU 106 communicates with the RRHs 108 (for example; the first RRH and the second RRH), that are connected with the corresponding UEs 104 and obtains the parameters of the UEs 104 at the current instance of time. The BBU 106 further determines the parameters for performing the compression using the machine learning method. Alternatively, the BBU 106 forwards the parameters of the UEs 104 to the external server 201 and receives the parameters determined for performing the compression using the machine learning method. Based on the parameters that are determined using the machine learning method, the BBU 106 performs the compression (at the PHY layer) on the data received from the core network 102. The BBU 106 transfers the compressed data to the first and second RRHs 108 through the fronthaul link. In an example herein, transferring of the compressed data from the BBU 106 to the first and second RRHs 108 involves transferring of the compressed data from the PHY layer of the BBU 106 to the PHY layer of the first and second RRHs 108.

On receiving the compressed data from the BBU 106, the first and second RRHs 108 decompress the received compressed data by accessing the parameters that are determined using the machine learning method from the BBU 106. The first and second RRHs 108 further transfer the decompressed data to the connected UEs 104. Thus, performing the compression and decompression based on the parameters that are determined using the machine learning method reduces the fronthaul bandwidth and mitigates congested and jittery fronthaul link.

FIG. 5 is an example diagram depicting the compression performed on the data to transfer over the fronthaul link, according to embodiments as disclosed herein. Considering an example scenario, wherein the at least one UE 104 connects to the at least one radio node such as the at least one RRH 108 and sends the RF signals to the at least one RRH 108. In an example herein, the RF signals refer to the data corresponding to the at least one service session, which is to be transferred to the external data network. The at least one RRH 108 receives the RF signals of the at least one UE 104 through the at least one antenna 302 and up-converts the RF signals to the IF signals/Baseband signals by converting the RF signals from its analog from to the digital data. Thereafter, the at least one RRH 108 compresses the converted digital data in order to transfer the data to the at least one centralized node 106 (in an example herein; the BBU 106) through the fronthaul link. In an embodiment, in order to perform the compression, the at least one RRH 108 communicates with the BBU 106 and obtains the parameters that are determined using the machine learning from the BBU 106. Based on the received parameters, the at least one RRH 108 compresses the data of the at least one UE 104.

For performing the compression, the at least one RRH 108 segregates the IQ samples of the received data of the at least one UE 104. In an example herein, the at least one RRH 108 segregates the IQ samples of the received data based on the resource allocation information (for example: the PRB information, the MCS information or the like that have been determined using the machine learning method). The at least one RRH 108 further normalizes the segregated IQ samples by exploiting the distribution of the at least one UE/user in the network 100. The at least one RRH 108 normalizes the segregated IQ samples using the at least one parameter determined using the machine learning as the division factor. Examples of the at least one parameter can be at least one of the resource type of the bearer (for example: the GBR, the non-GBR or the like), the bearer QoS (for example: the instantaneous SINR, the average SINR, the delay, the BLER, or the like), the PDF functions, (for example: the positive max, the positive min, the negative max, the negative min, or the like), the central moments of the UE distribution function (for example; the mean, the variance, the median or the like), the channel QoS, the CQI (for example; uplink quality, downlink quality, or the like), the resource allocation information (for example; the PRBs information), the QCI, and so on. The at least one RRH 108 further multiplies the normalized IQ samples with the desired resolution. In an example herein, the at least one RRH 108 multiplies the normalized IQ samples with the $(2^{\{M\_j\}})/(2^{\{M\_j\}}-1)$, wherein M_j is a desired resolution. The multiplied IQ samples may correspond to the compressed data of the at least one UE 104. Thereafter, the at least one RRH 108 packs the compressed data using the header of the suitable format. The at least one RRH 108 transfers the packed compressed data to the BBU 106 through the fronthaul link.

On receiving the packed compressed data from the at least one RRH 108, the BBU 106 decompresses the compressed data in order to transfer the data to the core network 102. For performing the decompression, the BBU 106 unpacks the compressed data by decoding the packet header of the compressed data. The BBU 106 then multiplies the IQ samples of the compressed data with the desired resolution. Thereafter, the BBU 106 normalizes the multiplied IQ samples with the at least one parameter that is determined using the machine learning. The normalized IQ samples may correspond to the decompressed data. The BBU 106 further transfers the decompressed data of the at least one UE 104 to the core network 102 by performing the baseband operations.

FIGS. 6A-6C depict the header formats used for packing the compressed data, according to embodiments as disclosed herein. Embodiments herein enable the at least one of the RRH 108 and the BBU 106 to transfer the compressed data over the fronthaul link with the header that can support the compressed data. The at least one of the RRH 108 and the BBU 106 may add the header with compressed data based on the parameters that are determined using the machine learning method for performing the compression, that results in the header of a less size.

In an embodiment, the header may include information about the maximum value and minimum values of the IQ samples of the received data (derived based on the PDF function) as illustrated in FIG. 6A, when the number of RRHs 108 are less and there is a direct fronthaul between the RRH and the BBU 108.

In an embodiment, the header may include information/fields about the maximum value of the IQ samples of the received data, the sequence number, the sector number, and the compressed payload as illustrated in FIG. 6B, when the number of RRHs 108 are more and there are more routers between the RRH 108 and the BBU 106.

In an embodiment, the header may include fields/information such as, a maximum value of the IQ samples of the received data derived from the PDF, a sequence number, an antenna number, a sector number, a parameter-X, a parameter-Y, a start PRB, a PRB length, used QoS, a minimum value of the IQ samples of the received data derived based on the PDF, a UE distribution function, used CQI, and a compressed payload in case of the complex network as illustrated in FIG. 6C.

FIG. 7 is an example table depicting the maintained history of parameters, which can be used for determining the parameters for performing the compression and the decompression, according to embodiments as disclosed herein. Embodiments herein enable at least one of the radio node 108 and the centralized node 106 to perform the compression based on the parameters of the UE corresponding to the data of a particular service session.

Consider an example scenario, wherein the at least one RRH 108 receives the data from the at least one UE 104, wherein the received data corresponds to a conversational video streaming session. In such a scenario, the at least one RRH 108 communicates with the BBU 106 and access the at least one parameter for performing the compression on the received data. In an example herein, consider that the BBU 106 determines the GBR resource type as the parameter for performing the compression based on the maintained history of parameters as illustrated in the example table of FIG. 7. On receiving the GBR resource type as the parameter, the at least one RRH 108 performs the compression with the lesser compression rate, since the GBR resource type associated with the received data (corresponding to the video streaming service) requires smaller packet error loss rate (for example: $<10^{-6}$). In an example herein, performing the compression with the lesser compression rate involves encoding 16 bit I or/and Q sample of the received data as 12 bit number.

Consider an example scenario, wherein the at least one RRH 108 receives the data from the at least one UE 104, wherein the received data corresponds to an interactive gaming session. In such a scenario, the at least one RRH 108 communicates with the BBU 106 and access the at least one parameter for performing the compression on the received data. In an example herein, consider that the BBU 106 determines the non-GBR resource type as the parameter for performing the compression based on the maintained history of parameters as illustrated in the example table of FIG. 7. On receiving the non-GBR resource type as the parameter, the at least one RRH 108 performs the compression with the higher compression rate, since the non-GBR resource type associated with the received data (corresponding to the interactive gaming session) requires a packet error loss rate of $<10^{-3}$. In an example herein, performing the compression with the higher compression rate involves encoding 16 bit I or/and Q sample of the received data as 7 or 8 bit numbers.

In an embodiment, the at least one of the radio node 108 and the centralized node 106 can also perform the compression based on the QCI values associated with the resource type of the bearer (the GBR or the non-GBR), when the resource type of the bearer is determined as the parameter for performing the compression.

In an embodiment, the at least one of the radio node 108 and the centralized node 106 can also dynamically change the compression rate for compressing the data based on the CQI. The CQI may represent channel quality of the service session corresponding to the received data. If the channel quality is good, then fluctuation of signal quality may not so dynamic. If the channel quality is bad, then there may be a dynamic range of fluctuation of the signal quality.

Consider an example scenario, wherein the RRH 108 receives the data from the at least one UE 104, wherein the received data corresponds to a live streaming scenario. In such a scenario, the at least one RRH 108 communicates with the BBU 106 and access the at least one parameter for performing the compression on the received data. In an example herein, consider that the BBU 106 determines the GBR resource type, the CQI indicating the bad channel quality, the variance of the IQ samples of the received data (can be higher due to the bad channel quality) as the parameters for performing the compression using the example table of FIG. 7. On receiving such parameters, the at least one RRH 108 performs the compression with the lesser compression rate and by allocating more PRB resources in order to meet the requirements of the GBR resource type for the received data. After a pre-defined period, the at least one RRH 108 may start receiving the data from the at least one UE 104 corresponding to a buffered streaming session. In such a scenario, the at least one RRH 108 communicates with the BBU 106 and access the at least one parameter for performing the compression on the received data. In an example herein, consider that the BBU 106 determines the non-GBR resource type, the CQI indicating the good channel quality, the variance of the IQ samples of the received data (can be lesser due to the good channel quality) as the parameters for performing the compression using the example table as depicted in FIG. 7. On receiving the parameters, the at least one RRH 108 performs the compression with the higher compression rate. Thus, the compression rates may be dynamically changed based on the parameters associated with the service sessions of the received data.

In an embodiment, the at least one of the RRH 108 and the BBU 106 can perform the multi-level compression when the CQI is determined as the parameter for performing the compression. The multi-level compression can be performed based on packet delay budget (for example; it may vary from 0 to 300 ms), the PRBs allocated by a MAC scheduler based on the QCI, and so on. If the allocated PRBs are more, then the higher compression rate may be used to perform the compression at second and subsequent levels of the compression. Further, the compression performed at the second and subsequent levels may include the lossless compression.

In an example herein, the at least one of the RRH 108 and the BBU 106 can perform the multi-level compression with the higher compression rate for the CQI indicating the good channel quality. In an example herein, the at least one of the RRH 108 and the BBU 106 can perform the multi-level compression for the CQI indicating the bad channel quality, wherein the lesser compression rate may be used for performing the compression at a first level and a higher compression rate with a Huffman coding (the loss-less compression) may be used for performing the compression at the successive levels.

FIG. 8 is an example table depicting the hierarchical compression performed based on the CQI and the QoS PER, according to embodiments as disclosed herein. Embodiments herein enable the at least one of the RRH 108 and the BBU 106 to perform the multi-level/hierarchical compression based on the CQI and the QoS PER. In an embodiment, the at least one of the RRH 108 and the BBU 106 may perform the compression at a first level using the parameters that are determined using the machine learning and may use the loss-less compression such as the Huffman coding for performing the compression at the second and successive levels of the compression.

In an example herein, the at least one of the RRH 108 and the BBU 106 may perform a two-level compression when the CQI indicating the good channel quality and the PER ranging between $10^{-6}$ and $10^{-3}$ are determined as parameters for performing the compression.

In an example herein, the at least one of the RRH 108 and the BBU 106 may perform a single level compression or a two-level compression when the CQI indicating the bad channel quality and the PER ranging between $10^{-6}$ and $10^{-3}$ are determined as parameters for performing the compression.

In an example herein, the at least one of the RRH 108 and the BBU 106 may perform the single level compression when the CQI indicating the good channel quality and the PER lesser than $10^{-6}$ are determined as parameters for performing the compression.

FIG. 9A is an example sequence diagram depicting the compression performed during the uplink transfer of the data, according to embodiments as disclosed herein. The UE 104 (at a time instant T1) sends the scheduling request to the connected RRH 108 on a Physical Uplink Shared Channel (PUSCH). The RRH 108 further forwards (at a time instant T2) the received scheduling request of the UE 104 to the BBU/V-RAN 106. On receiving the scheduling request, the V-RAN 106 determines the parameters of the UE 104 such as, the CQI, the QOS, the MCS, the PRB, and so on for performing the compression using the machine learning method. The V-RAN 106 further forwards (at a time instant T3) the determined parameters to the RRH 108. The RRH 108 communicates (at a time instant T4) the received parameters from the V-RAN 106 to the UE 104. Thereafter the UE 104 transfers (at a time instant T5) the data to the RRH 108 on the PUSCH.

On receiving the data from the UE 104, the RRH 108 compresses the IQ samples of the received data using the parameters that are received from the V-RAN 106. The RRH 108 further packs the compressed data with the suitable header and transfers (at a time instant T6) the compressed data to the V-RAN 106 through the fronthaul link on the PUSCH. On receiving the compressed data from the RRH 108, the V-RAN 106 decodes/decompresses the data using the parameters, which have been determined by the V-RAN 106 at the time instant T3. The V-RAN 106 further communicates (at a time instant T7) an acknowledgment to the RRH 108 on a Physical Hybrid Automatic Repeat Request (HARQ) Indicator Channel (PHICH), if the V-RAN has decoded the compressed data successfully. The RRH 108 forwards (at time instant) the received acknowledgment to the UE 104. The V-RAN 106 may also communicate a negative acknowledgment to the RRH 108, if the V-RAN has not able to decode the compressed data successfully.

FIG. 9B is an example sequence diagram depicting the compression performed during the downlink transfer of data, according to embodiments as disclosed herein. The V-RAN 106 receives the data from the core network 102 and compresses the received data using the parameters that are determined using the machine learning method. The V-RAN 106 further packs the compressed data using the suitable header and transfers (at a time instant T1) the packed compressed data to the RRH 108 through the fronthaul link. The RRH 108 forwards (at a time instant T2) the received compressed data to the UE 104 on a Physical Downlink Shared Channel (PDSCH). The UE 104 decodes the received compressed data and sends (at a time instant T3) an acknowledgement to the RRH 108 on a successful decoding of the received compressed data. The RRH 108 forwards (at a time instant T4) the received acknowledgment to the V-RAN 106. The UE 104 may also send a negative acknowledgement to the RRH 108 on an unsuccessful decoding of the received compressed data. The RRH 108 forwards the received negative acknowledgment to the V-RAN 106.

FIG. 10 is an example graph depicting a bandwidth comparison for a transfer of uncompressed data and the transfer of the compressed data (using the parameters that are determined using the machine learning method) over the fronthaul link, according to embodiments as disclosed herein.

FIG. 11A is a flow diagram 1100 depicting a method for performing the compression to transfer the data over the fronthaul link by reducing the fronthaul bandwidth, according to embodiments as disclosed herein. At step 1102, the method includes receiving by at least one first device (106, 108), the data from at least one second device (102, 104). The at least one first device (106, 108) can be at least one of the at least one centralized node 106, and the at least one radio node 108. The at least one second device (102, 104) can be at least one of the core network 102, and the at least one UE 104.

At step 1104, the method includes compressing, by the at least one first device (106, 108), the received data using the parameters that are determined using the machine learning method. Examples of the parameters can be at least one of the resource type of the bearer (for example: the GBR, the non-GBR or the like), the bearer QoS (for example: the instantaneous SINR, the average SINR, the delay, the BLER, or the like), the PDF functions, (for example: the positive max, the positive min, the negative max, the negative min, or the like), the central moments of the UE distribution function (for example; the mean, the variance, the median or the like), the channel QoS, the CQI (for example; uplink quality, downlink quality, or the like), the resource allocation information (for example; the PRBs information), the QCI, and so on.

At step 1106, the method includes transferring, by the at least one first device (106, 108), the compressed data to at least one third device (108, 106) over the fronthaul link/interface. The at least one third device (108, 106) can be at least one of the at least one radio node 108, and the at least one centralized node 106. The various actions in method 1100a may be performed in the order presented, in a different order or simultaneously. Further, in some embodiments, some actions listed in FIG. 11A may be omitted.

FIG. 11B is a flow diagram 1110b depicting a method for performing the decompression using the parameters that are determined using the machine learning method, according to embodiments as disclosed herein.

At step 1108, the method includes receiving, by the at least one first device (106, 108), the compressed data from the at least one third device (108, 106) over the fronthaul interface. At step 1110, the method includes performing, by the at least one first device (106, 108), a decompression on the compressed data received from the at least one third device based on the parameters determined using the machine learning. At step 1112, the method includes transmitting, by the at least one first device (106, 108), the decompressed data to the at least one second device. The various actions in method 1100b may be performed in the order presented, in a different order or simultaneously. Further, in some embodiments, some actions listed in FIG. 11B may be omitted.

Embodiments herein reduces usage of fronthaul bandwidth during a transfer of data between at least one radio node and at least one centralized node in a wireless network, wherein the wireless network can be at least one of a Centralized Radio Access Network (RAN), a cloud-RAN (C-RAN), a Virtualized-RAN (V-RAN), a Long Term Evolution (LTE) network, a New Radio 5G network, and so on.

Embodiments herein perform the compression to transfer the data over a fronthaul link/interface using parameters specific to at least one User Equipment (UE) that are determined using a machine learning method. Transferring the data over the fronthaul link by performing the compression using the parameters determined using the machine learning method:

achieves compression ratio of more than 2:1 and less than 3:1 based on transport layer parameters;
 achieves better Signal to Quantization Noise Ratio (SQNR) and better performance at Error Vector Magnitude (EVM) of 28 dB;
 provides bear minimal loss and smaller latency;
 supports larger bandwidths by effectively compressing the fronthaul bandwidth;
 supports larger coverage areas with lesser maintenance, by connecting more radio nodes to the at least one centralized node;
 results in less backhaul maintenance and investment for laying fiber between the at least one radio node and the at least one centralized node in the fronthaul;
 increases system/network throughput without increasing fronthaul bandwidth requirements; and
 reduces requirements for a higher number of radio nodes in the wireless network.

Embodiments herein perform the decompression using the parameters specific to the at least one UE that are determined using the machine learning method.

The present disclosure provides a method (1100a) for reducing fronthaul bandwidth in a wireless network (100), the method comprising: receiving (1102), by at least one first device (106, 108), data from at least one second device (102, 104); performing (1104), by the at least one first device (106, 108), a compression on the received data from the at least one second device (102, 104) based on at least one parameter; and transmitting (1106), by the at least one first device (106, 108), the compressed received data to at least one third device (108, 106) over at least one fronthaul interface.

In the present disclosure, wherein the received data is for at least one of an uplink data transfer, and a downlink transfer.

In the present disclosure, wherein the at least one first device (106, 108) is at least one radio node (108) including at least one of a Remote Radio Head (RRH) (106), and a Remote Radio Unit (RRU) (106), the at least one second device (102, 104) is at least one User Equipment (UE) (104), and the at least one third device (108, 106) is at least one centralized node (106) including at least one of a Base Band Unit (BBU) (108), a Virtualized-Radio Access Network (V-RAN) (108) and a Cloud-RAN (C-RAN) (108).

In the present disclosure, wherein the at least one first device (106, 108) is the at least one centralized node (106) including at least one of the BBU (106), the V-RAN (106) and the C-RAN (106), the at least one second device (102, 104) is a core network (CN) (102), and the at least one third device (106, 108) is the at least one radio node (108) including at least one of the RRH (108), and the RRU (108).

In the present disclosure, wherein the at least one first device (106, 108) and the at least one third device (106, 108) are at least of an eNodeB (eNB) (106), a relay eNB (108), a gNode (gNB) (106), a relay gNodeB (108), the at least one second device (102, 104) is the at least one UE (104), and the fronthaul interface is an X2 interface.

In the present disclosure, wherein the at least one parameter is specific to the at least one UE (104), wherein the at least one parameter includes at least one of a resource type of a bearer including at least one of a Guaranteed Bit Rate (GBR) resource type and a non-GBR resource type, bearer Quality of Service (QoS) including at least one of instantaneous Signal to interference plus noise ratio (SINR), average SINR, delay, and Block Error Rate (BLER), resource allocation information including at least one of Modulation and Encoding Scheme (MCS) and Physical Resource Blocks (PRBs) information, channel QoS information, parameters derived based on Probability Density Function (PDF) including at least one of positive maximum (max), positive minimum (min), negative max, and negative min of the received data, central moments of a UE distribution function including at least one of a mean, a median and a variance, delay tolerance requirements, QoS-Packet Error Rate (QoS-PER), a QoS class identifier (QCI), and a Channel Quality Indicator (CQI).

In the present disclosure, wherein the at least one parameter is determined using machine learning.

In the present disclosure, wherein the at least one parameter is determined by: receiving the at least one parameter related to the at least one UE (104) corresponding to each Cell-Radio Network Temporary Identifier (C-RNTI) from at least one radio node (108); maintaining a history of the received at least one parameter related to the at least one UE (104); receiving a scheduling request for the at least one parameter from the at least one radio node (108) for transferring data of the at least one UE (104); assigning at least one weight to the at least one parameter using the maintained history; and determining the at least one parameter of the at least one UE (104) and an associated value based on the at least one weight for performing compression and decompression of the received data.

In the present disclosure, wherein performing the compression on the received data includes: segregating the data received from the at least one second device (102, 104), wherein the data includes In-phase-Quadrature (IQ) samples; normalizing the segregated IQ samples using the determined at least one parameter and the associated value; performing a multiplication on the normalized IQ samples using the determined at least one parameter and the associated value to compress the normalized IQ samples; and packing the compressed IQ samples by adding a header for the compressed IQ samples.

In the present disclosure, wherein the received data is segregated based on resources allocated to the at least one UE (104).

In the present disclosure, further comprising performing, by the at least one first device (106, 108), a multi-level compression based on the at least one parameter determined using the machine learning, wherein the multi-level compression includes at least one of a loss-less compression, and a lossy compression.

In the present disclosure, wherein the header is added using at least one of: a first format including a max value of the IQ samples of the received data and a min value of the IQ samples of the received data that are derived based on the PDF, wherein the first format is used in a presence of a direct fronthaul interface between the at least one first device and the at least one third device; a second format including the max value of the IQ samples of the received data, a sequence number, and a sector number, wherein the second format is used in a presence of at least one router between the at least one first device and the at least one third device; and a third format including at least one of the max value, the sequence number, an antenna number, the sector number, parameters determined for future use, a start PRB, a PRB length, the QoS, the min value of the IQ samples, the central moments of the UE distribution function, and a CQI, wherein the third format is used based on complexity of the wireless network.

In the present disclosure, the method comprising: receiving, by the at least one first device (106, 108), compressed data from the at least one third device (108, 106) over the at least one fronthaul interface; performing, by the at least one first device (106, 108), a decompression on the compressed data received from the at least one third device (108, 106) based on the at least one determined parameter; and transmitting, by the at least one first device (106, 108), the decompressed data to the at least one second device (102, 104).

In the present disclosure, wherein performing, by the at least one first device (106, 108), the decompression includes: unpacking the received compressed data including the IQ samples by removing the header; and performing the multiplication on the compressed IQ samples using the determined at least one parameter and the associated value; and normalizing the compressed IQ samples using the determined at least one parameter and the associated value after performing the multiplication to obtain the data.

The present disclosure provides a method for reducing fronthaul bandwidth in a wireless network (100), the method comprising: receiving, by at least one first device (106, 108), data from at least one second device (102, 104) performing, by the at least one first device (106, 108), a compression on the received data from the at least one second device (102, 104) based on at least one parameter; adding, by the at least one first device (106, 106), a header to the compressed received data; and transmitting, by the at least one first device (106, 106), the compressed received data along with the header to at least one third device (108, 106) over at least one fronthaul interface.

In the present disclosure, wherein the received data is for at least one of an uplink data transfer, and a downlink data transfer.

In the present disclosure, wherein the at least one parameter is determined using machine learning.

In the present disclosure, wherein the compression includes a multi-level compression, and the multi-level compression includes at least one of a loss-less compression and a lossy compression in each level.

In the present disclosure, wherein the at least one first device (106, 108) and the at least third device (108, 106) include at least one of at least one centralized node (108) and at least one radio node (106), and the at least one second device (102, 104) includes at least one of at least one User Equipment (UE) (104) and a Core Network (CN) (102).

In the present disclosure, wherein performing the compression includes: segregating the data received from the at least one second device (102, 104) based on resources allocated to the at least one UE (104), wherein the data includes In-phase-Quadrature (IQ) samples; normalizing the segregated IQ samples based on the at least one parameter determined using the machine learning; performing a multiplication on the normalized IQ samples based on the at least one parameter determined using the machine learning to compress the normalized IQ samples, wherein the at least one parameter includes at least one of a resource type of a bearer including at least one of a Guaranteed Bit Rate (GBR) resource type and a non-GBR resource type, bearer Quality of Service (QoS) including at least one of instantaneous Signal to interference plus noise ratio (SINR), average SINR, delay, and Block Error Rate (BLER), resource allocation information including at least one of Modulation and Encoding Scheme (MCS) and Physical Resource Blocks (PRBs) information, channel QoS information, parameters derived based on Probability Density Function (PDF) including at least one of positive maximum (max), positive minimum (min), negative max, and negative min of the received data, central moments of a UE distribution function including at least one of a mean, a median and a variance, delay tolerance requirements, QoS-Packet Error Rate (QoS-PER), a QoS class identifier (QCI), and a Channel Quality Indicator (CQI); and packing the compressed IQ samples.

The present disclosure provides a method for performing fronthaul decompression, the method comprising: receiving, by at least one first device (106, 108), compressed data from at least one second device (108, 106) over at least one fronthaul interface; unpacking, by the at least one first device (106, 108), the compressed data by removing a header from the compressed data; performing, by the at least one first device (106, 108), a decompression on the compressed data using at least one parameter determined using a machine learning; and transmitting, by the at least one first device (106, 108), the decompressed data to at least one third device (102, 104).

In the present disclosure, wherein the at least one first device (106, 108) and the at least second device (108, 106) include at least one of at least one centralized node (106) and at least one radio node (108), and the at least one third device (102, 104) includes at least one of at least one User Equipment (UE) (104) and a Core Network (CN) (102).

In the present disclosure, wherein performing, by the at least one first device (106, 108), the decompression includes: performing the multiplication on the compressed data including In-phase-Quadrature (IQ) samples using the determined at least one parameter; and normalizing the compressed IQ samples using the determined at least one parameter after performing the multiplication to obtain the data, wherein the at least one parameter includes at least one of a resource type of a bearer including at least one of a Guaranteed Bit Rate (GBR) resource type and a non-GBR resource type, bearer Quality of Service (QoS) including at least one of instantaneous Signal to interference plus noise ratio (SINR), average SINR, delay, and Block Error Rate (BLER), resource allocation information including at least one of Modulation and Encoding Scheme (MCS) and Physical Resource Blocks (PRBs) information, channel QoS information, parameters derived based on Probability Density Function (PDF) including at least one of positive maximum (max), positive minimum (min), negative max, and negative min of the received data, central moments of a UE distribution function including at least one of a mean, a median and a variance, delay tolerance requirements, QoS-Packet Error Rate (QoS-PER), a QoS class identifier (QCI), and a Channel Quality Indicator (CQI).

The present disclosure provides a method for Front Haul Bandwidth (FHL) reduction in a Virtual Radio Access Network (VRAN) (108), the method comprising: receiving, by an Remote Radio head (RRH) (106), a wireless signal from a User Equipment (UE) (104); processing, by the RRH (106), the received signal to produce In-phase Quadrature (IQ) data; normalizing, by the RRH (106), the IQ data using a normalization factor; multiplying, by the RRH (106), the normalized IQ date by a multiplication factor to produce a modified IQ data; and sending, by the RRH (106), modified IQ data along with the normalization factor and multiplication factor to the VRAN (108) to reduce front haul bandwidth.

The embodiments disclosed herein can be implemented through at least one software program running on at least one hardware device and performing network management functions to control the elements. The elements shown in FIGS. 1A-11B can be at least one of a hardware device, or a combination of hardware device and software module.

The embodiments disclosed herein describe methods and systems for reducing the fronthaul bandwidth. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL) another programming language, or implemented by one or more VHDL or several software modules being executed on at least one hardware device. The hardware device can be any kind of portable device that can be programmed. The device may also include means which could be e.g. hardware means like e.g. an ASIC, or a combination of hardware and software means, e.g. an ASIC and an FPGA, or at least one microprocessor and at least one memory with software modules located therein. The method embodiments described herein could be implemented partly in hardware and partly in software. Alternatively, the invention may be implemented on different hardware devices, e.g. using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those skilled in the art will recognize that the embodiments herein can be practiced with modification within the spirit and scope of the embodiments as described herein.

The invention claimed is:

1. A method performed by a first device in a wireless communication system, the method comprising:
receiving, from at least one second device, data;
performing a compression on the received data from the at least one second device based on at least one parameter; and
transmitting, to at least one third device over at least one fronthaul interface, the compressed received data,
wherein the at least one parameter for the compression is determined based on at least one weight assigned to at least one parameter related to at least one user equipment (UE), and
wherein the at least one weight is assigned to the at least one parameter related to the at least one UE based on a maintained history of the at least one parameter related to the at least one UE using a machine learning method.

2. The method of claim 1, wherein the received data is for at least one of an uplink data transfer, and a downlink transfer.

3. The method of claim 1, wherein the first device is at least one radio node including at least one of a remote radio head (RRH), and a remote radio unit (RRU), the at least one second device is the at least one user equipment (UE), and the at least one third device is at least one centralized node including at least one of a base band unit (BBU), a virtualized radio access network (V-RAN) and a cloud-RAN (C-RAN).

4. The method of claim 1, wherein the first device is at least one centralized node including at least one of a BBU, a V-RAN and a C-RAN, the at least one second device is a core network (CN), and the at least one third device is at least one radio node including at least one of a RRH, and a RRU.

5. The method of claim 1,
wherein the first device and the at least one third device are at least of an eNodeB (eNB), a relay eNB, a gNode (gNB), a relay gNodeB, the at least one second device is the at least one UE, and the at least one fronthaul interface is an X2 interface.

6. The method of claim 1,
wherein the at least one parameter is specific to the at least one UE,
wherein the at least one parameter includes at least one of a resource type of a bearer including at least one of a guaranteed bit rate (GBR) resource type and a non-GBR resource type, bearer quality of service (QoS) including at least one of instantaneous signal to interference plus noise ratio (SINR), average SINR, delay, and block error rate (BLER), resource allocation information including at least one of modulation and encoding scheme (MCS) and physical resource blocks (PRBs) information, channel QoS information, parameters derived based on probability density function (PDF) including at least one of positive maximum (max), positive minimum (min), negative max, and negative min of the received data, central moments of a UE distribution function including at least one of a mean, a median and a variance, delay tolerance requirements, QoS packet error rate (QoS-PER), a QoS class identifier (QCI), and a channel quality indicator (CQI).

7. The method of claim 6, wherein the at least one parameter is determined using machine learning.

8. The method of claim 7, wherein the at least one parameter is determined by:
receiving the at least one parameter related to the at least one UE corresponding to each cell radio network temporary identifier (C-RNTI) from at least one radio node;
maintaining a history of the received at least one parameter related to the at least one UE;
receiving a scheduling request for the at least one parameter from the at least one radio node for transferring data of the at least one UE;
assigning at least one weight to the at least one parameter using the maintained history; and
determining the at least one parameter of the at least one UE and an associated value based on the at least one weight for performing compression and decompression of the received data.

9. The method of claim 1, wherein performing of the compression on the received data includes:
segregating the data received from the at least one second device, wherein the data includes in-phase-quadrature (IQ) samples;
normalizing the segregated IQ samples using the determined at least one parameter and the associated value;
performing a multiplication on the normalized segregated IQ samples using the determined at least one parameter and the associated value to compress the normalized segregated IQ samples; and
packing the compressed IQ samples by adding a header for the compressed IQ samples.

10. The method of claim 9, wherein the received data is segregated based on resources allocated to the at least one UE.

11. The method of claim 9, further comprising performing a multi-level compression based on the at least one parameter determined using machine learning, wherein the multi-level compression includes at least one of a loss-less compression, and a lossy compression.

12. The method of claim 9, wherein the header is added using at least one of:
a first format including a max value of the IQ samples of the received data and a min value of the IQ samples of the received data that are derived based on a probability density function (PDF), wherein the first format is used in a presence of a direct fronthaul interface between the first device and the at least one third device;
a second format including the max value of the IQ samples of the received data, a sequence number, and a sector number, wherein the second format is used in a presence of at least one router between the first device and the at least one third device; and
a third format including at least one of the max value, the sequence number, an antenna number, the sector number, parameters determined for future use, a start physical resource block (PRB), a PRB length, a quality of service (QOS), the min value of the IQ samples, central moments of a UE distribution function, and a channel quality indicator (CQI), wherein the third format is used based on complexity of a wireless network.

13. The method of claim 1, the method comprising:
receiving, from the at least one third device over the at least one fronthaul interface, compressed data;
performing a decompression on the compressed data received from the at least one third device based on the determined at least one parameter; and
transmitting, to the at least one second device, the decompressed data.

14. The method of claim 13, wherein performing of the decompression includes:
unpacking the received compressed data including IQ samples by removing the header; and
performing multiplication on the IQ samples using the determined at least one parameter and the associated value; and
normalizing the IQ samples using the determined at least one parameter and the associated value after performing the multiplication to obtain the data.

15. A first device in a wireless communication system, comprising:
a transceiver;
a controller coupled with the transceiver and configured to:
receive, from at least one second device, data;

perform a compression on the received data from the at least one second device based on at least one parameter; and transmit, to at least one third device over at least one fronthaul interface, the compressed received data, wherein the at least one parameter for the compression is determined based on at least one weight assigned to at least one parameter related to at least one user equipment (UE), and wherein the at least one weight is assigned to the at least one parameter related to the at least one UE based on a maintained history of the at least one parameter related to the at least one UE using a machine learning method.

* * * * *